(12) United States Patent
Nagumo

(10) Patent No.: US 7,990,407 B2
(45) Date of Patent: Aug. 2, 2011

(54) DRIVE CIRCUIT, LIGHT PRINT HEAD, AND IMAGE FORMING APPARATUS

(75) Inventor: Akira Nagumo, Tokyo (JP)

(73) Assignee: Oki Data Corporation, Tokyo (JP)

( * ) Notice: Subject to any disclaimer, the term of this patent is extended or adjusted under 35 U.S.C. 154(b) by 157 days.

(21) Appl. No.: 12/379,656

(22) Filed: Feb. 26, 2009

(65) Prior Publication Data
US 2009/0237483 A1 Sep. 24, 2009

(30) Foreign Application Priority Data
Mar. 18, 2008 (JP) ................. 2008-070473

(51) Int. Cl.
*B41J 2/435* (2006.01)
*B41J 2/47* (2006.01)

(52) U.S. Cl. ........................ 347/237; 347/247

(58) Field of Classification Search .......... 347/237, 347/238, 247
See application file for complete search history.

(56) References Cited

U.S. PATENT DOCUMENTS

| 5,969,744 A * | 10/1999 | Sakashita et al. ............ 347/237 |
| 6,710,794 B1 * | 3/2004 | Yamazaki et al. ............ 347/237 |
| 7,286,259 B2 * | 10/2007 | Ohno et al. .................... 358/1.8 |
| 2004/0228057 A1 * | 11/2004 | Mayama et al. .............. 361/100 |

FOREIGN PATENT DOCUMENTS
JP 2004-195796 7/2004
* cited by examiner

*Primary Examiner* — Hai C Pham
(74) *Attorney, Agent, or Firm* — Kubotera & Associates, LLC

(57) ABSTRACT

A drive circuit is provided for supplying a drive current to drive a plurality of driven elements each having two main electrodes. The drive circuit includes a switch circuit for receiving a drive signal; and a constant voltage circuit connected to the switch circuit for adjusting the drive current at a constant level.

7 Claims, 26 Drawing Sheets

DRIVE CIRCUIT, LIGHT PRINT HEAD, AND IMAGE FORMING APPARATUS

BACKGROUND OF THE INVENTION AND RELATED ART STATEMENT

The present invention relates to a drive circuit for driving a group of driven elements arranged in an array pattern, a light print head including the drive circuit; and an image forming apparatus including the light print head.

In a conventional image forming apparatus such as a printer of an electro-photography type, light is selectively irradiated a charged photosensitive drum according to print information to form a static latent image. Then, toner is attached to the static latent image for developing and forming a toner image, and the toner image is transferred and fixed to a sheet. In the conventional electro-photography type printer, in addition to a light emitting diode (LED), a light emitting thyristor is used as a light source.

When the light emitting diode is used as a light source, a drive circuit is disposed to correspond to the light emitting element with each other. The light emitting element is switched between a turned-on state and a turned-off state when a current directly flows or stops flowing between an anode terminal and a cathode terminal thereof.

On the other hand, when the light emitting thyristor is used as a light source, a drive circuit is disposed to correspond to an N number of the light emitting elements (N>1). In this case, a gate terminal thereof is used for selecting the light emitting element to emit light, and a current flows between an anode terminal and a cathode terminal thereof to adjust light emitting power.

Patent Reference has disclosed a light source using the light emitting thyristor with a configuration called a self-scanning LED. In this case, the light emitting thyristor performs a latch operation, so that a shift register operation is performed with a two-phase clock signal. Further, an anode of the light emitting thyristor is driven through a current regulating effect of a constant voltage power source output from a CMOS inverter and a series resistor (refer to Patent Reference).

Patent Reference: Japanese Patent Publication No. 2004-195796

As described above, in the drive circuit of the light emitting thyristor, the anode of the light emitting thyristor is driven through the current regulating effect of the constant voltage power source output from the CMOS inverter and the series resistor. In the configuration, when a voltage of the power source varies, a drive current varies significantly. Accordingly, an image forming apparatus using the configuration may form an image with an uneven density, thereby lowering print quality. Further, the resistor needs to be connected in series for regulating a current. Accordingly, it is difficult to turn on and off at a high speed due to a long rise time and a long fall time of a drive current, thereby making it difficult to increase an operational speed.

In view of the problems described above, an object of the present invention is to provide a drive circuit capable of solving the problems of the conventional drive circuit. A further object of the present invention is to provide a light print head including the drive circuit, and an image forming apparatus including the light print head.

In the present invention, it is possible to reduce a variance in a drive current due to a variance in a power source voltage or a manufacturing variance of a light emitting element. Accordingly, it is possible to reduce a density fluctuation in the image forming apparatus using the light emitting element, thereby improving print quality. Further, it is possible to turn on and off at a high speed through shortening a rise time and a fall time of a drive current, thereby making it possible to increase an operational speed.

Further objects and advantages of the invention will be apparent from the following description of the invention.

SUMMARY OF THE INVENTION

In order to attain the objects described above, according to a first aspect of the present invention, a drive circuit is provided for supplying a drive current to drive a plurality of driven elements each having two main electrodes. The drive circuit includes a switch circuit for receiving a drive signal; and a constant voltage circuit connected to the switch circuit for adjusting the drive current at a constant level.

According to a second aspect of the present invention, a light print head includes a drive circuit for supplying a drive current to drive a plurality of driven elements each having two main electrodes. The drive circuit includes a switch circuit for receiving a drive signal; and a constant voltage circuit connected to the switch circuit for adjusting the drive current at a constant level.

According to a third aspect of the present invention, an image forming apparatus includes a light print head having a drive circuit for supplying a drive current to drive a plurality of driven elements each having two main electrodes. The drive circuit includes a switch circuit for receiving a drive signal; and a constant voltage circuit connected to the switch circuit for adjusting the drive current at a constant level.

In the present invention, the constant voltage circuit is provided for adjusting the drive current at a constant level. Accordingly, it is possible to reduce a variance in the drive current due to a variance in a power source voltage or a manufacturing variance of a light emitting element. As a result, it is possible to maintain an output level of the driven element at a constant level. Further, it is possible to turn on and off at a high speed through shortening a rise time and a fall time of the drive current, thereby making it possible to increase an operational speed.

BRIEF DESCRIPTION OF THE DRAWINGS

FIGS. 3(a) to 3(d) are views showing a configuration of a light emitting thyristor according to the first embodiment of the present invention, wherein FIG. 3(a) is a circuit diagram of the light emitting thyristor, FIG. 3(b) is a sectional view of the light emitting thyristor, FIG. 3(c) is a sectional view of another configuration of the light emitting thyristor, FIG. 3(d) is a circuit diagram of the light emitting thyristor shown in FIG. 3(c);

FIGS. 7(a) and 7(b) are views showing an operation of an anode drive circuit according to the first embodiment of the present invention, wherein FIG. 7(a) is a circuit diagram of the anode drive circuit, and FIG. 7(b) is a graph of the operation of the anode drive circuit;

FIGS. 8(a) and 8(b) are views showing the operation of the anode drive circuit according to the first embodiment of the present invention, wherein FIG. 8(a) is a circuit diagram of the anode drive circuit, and FIG. 8(b) is a graph of the operation of the anode drive circuit;

FIGS. 15(a) to 15(c) are views showing a configuration of a depletion type transistor according to the second embodiment of the present invention, wherein FIG. 15(a) is a circuit diagram of the depletion type transistor, FIG. 15(b) is a sectional view of the depletion type transistor, and FIG. 15(c) is a sectional view of the depletion type transistor;

FIGS. 28(a) to 28(d) are circuit diagrams showing modified configurations of the anode drive circuit according to the first embodiment of the present invention, wherein FIG. 28(a) is the circuit diagram of the configuration of the anode drive circuit, FIG. 28(b) is a circuit diagram of a first modified configuration of the anode drive circuit, FIG. 28(c) is a circuit diagram of a second modified configuration of the anode drive circuit, and FIG. 28(d) is a circuit diagram of a third modified configuration of the anode drive circuit;

FIGS. 29(a) to 29(d) are circuit diagrams showing modified configurations of the anode drive circuit according to the second embodiment of the present invention, wherein FIG. 29(a) is the circuit diagram of the configuration of the anode drive circuit, FIG. 29(b) is a circuit diagram of a first modified configuration of the anode drive circuit, FIG. 29(c) is a circuit diagram of a second modified configuration of the anode drive circuit, and FIG. 29(d) is a circuit diagram of a third modified configuration of the anode drive circuit;

FIGS. 30(a) to 30(d) are circuit diagrams showing modified configurations of the anode drive circuit according to the third embodiment of the present invention, wherein FIG. 30(a) is the circuit diagram of the configuration of the anode drive circuit, FIG. 30(b) is a circuit diagram of a first modified configuration of the anode drive circuit, FIG. 30(c) is a circuit diagram of a second modified configuration of the anode drive circuit, and FIG. 30(d) is a circuit diagram of a third modified configuration of the anode drive circuit;

FIGS. 31(a) to 31(d) are circuit diagrams showing modified configurations of the anode drive circuit according to the fourth embodiment of the present invention, wherein FIG. 31(a) is the circuit diagram of the configuration of the anode drive circuit, FIG. 31(b) is a circuit diagram of a first modified configuration of the anode drive circuit, FIG. 31(c) is a circuit diagram of a second modified configuration of the anode drive circuit, and FIG. 31(d) is a circuit diagram of a third modified configuration of the anode drive circuit; and FIGS. 32(a) to 32(d) are circuit diagrams showing modified configurations of the anode drive circuit according to the fifth embodiment of the present invention, wherein FIG. 32(a) is the circuit diagram of the configuration of the anode drive circuit, FIG. 32(b) is a circuit diagram of a first modified configuration of the anode drive circuit, FIG. 32(c) is a circuit diagram of a second modified configuration of the anode drive circuit, and FIG. 32(d) is a circuit diagram of a third modified configuration of the anode drive circuit.

DETAILED DESCRIPTION OF PREFERRED EMBODIMENTS

Figure 1:
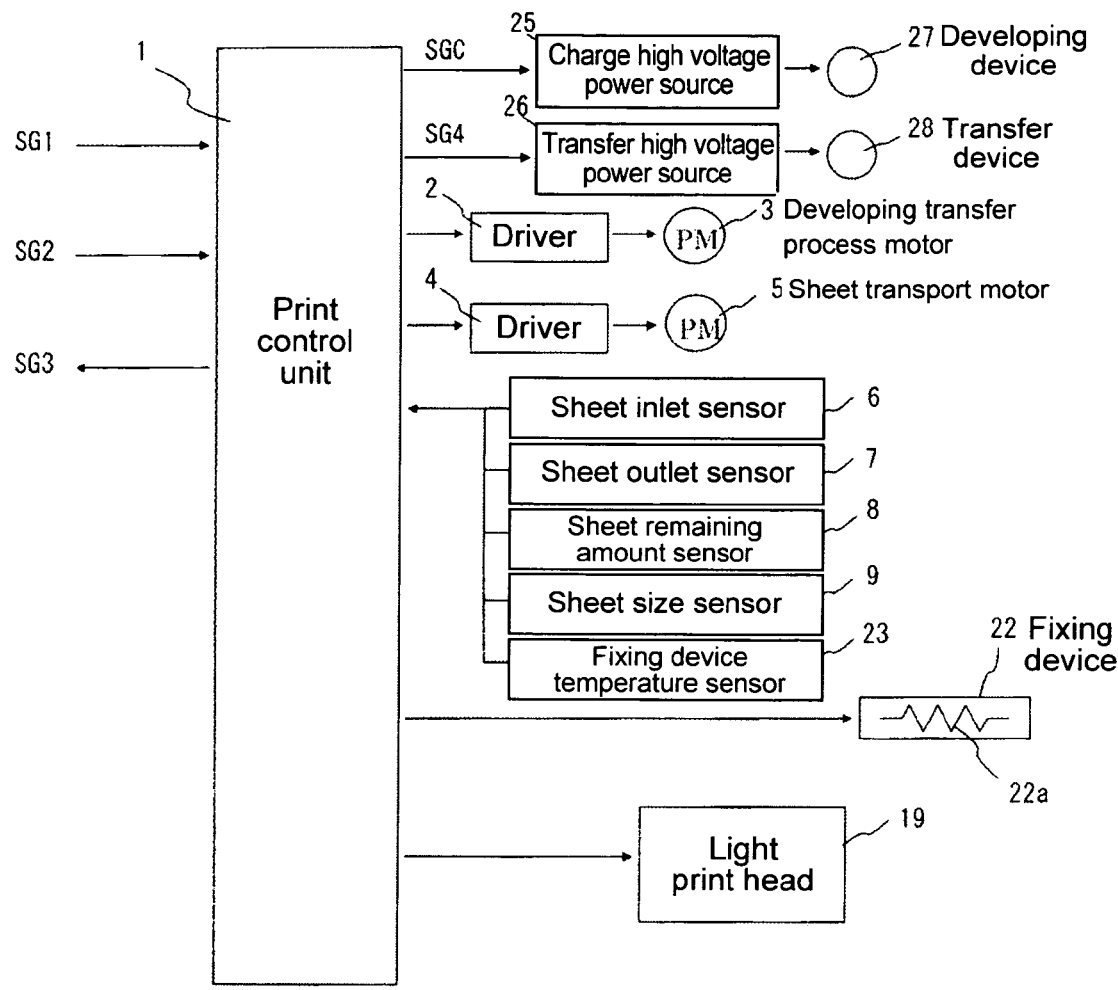
FIG. 1 is a block diagram showing a configuration of an electro-photography printer according to a first embodiment of the present invention.

Hereunder, preferred embodiments of the present invention will be explained with reference to the accompanying drawings. Similar components in the drawings are designated with the same reference numerals.

First Embodiment

Figure 2:
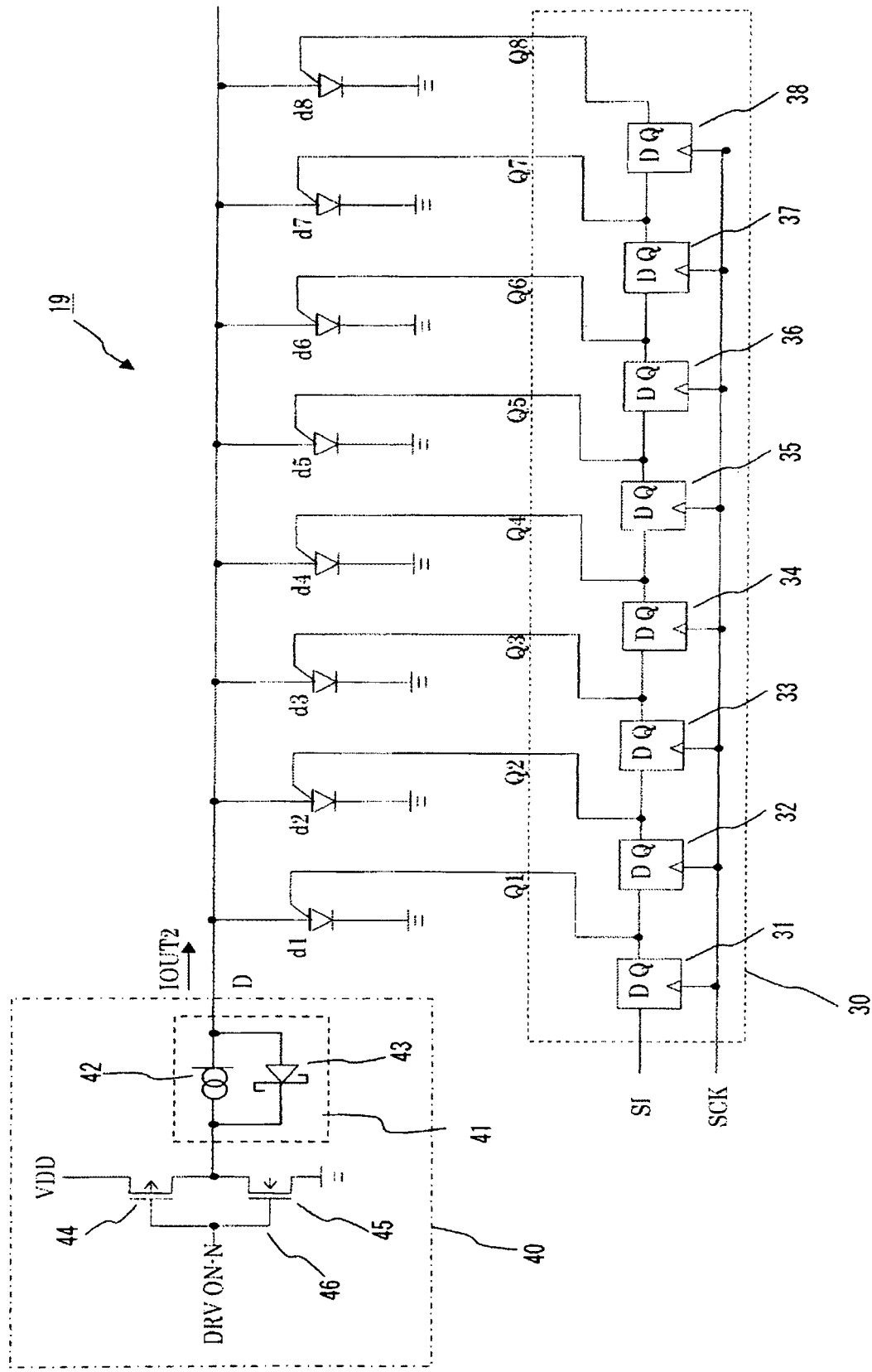
FIG. 2 is a circuit diagram showing a configuration of a light print head according to the first embodiment of the present invention.

A first embodiment of the present invention will be explained. FIG. 1 is a block diagram showing a configuration of an electro-photography printer according to the first embodiment of the present invention. FIG. 2 is a circuit diagram showing a configuration of a light print head 19 according to the first embodiment of the present invention.

As shown in FIG. 1, the electro-photography printer includes a print control unit 1 having a microprocessor, an ROM, an RAM, an input-output port, a timer, and the likes. The print control unit 1 sequentially controls an entire operation of the electro-photography printer to perform a printing operation according to a control signal SG1, a video signal SG2 (dot map data arranged in a one-dimensional pattern), and the likes sent from a host device (not shown).

In the embodiment, when the print control unit 1 receives a print instruction through the control signal SG1, the print control unit 1 controls a fixing device temperature sensor 23 to determine whether a fixing device 22 with a heater 22a is within an operable temperature range. When the fixing device 22 is not within the operable temperature range, the heater 22a is turned on to heat the fixing device 22 to an operable temperature. In the next step, the print control unit 1 controls a driver 2 to rotate a developer transfer process motor (PM) 3. At the same time, according to a charge signal SGC, the print control unit 1 turns on a charge high voltage power source 25 to charge a developing device 27.

In the embodiment, a sheet remaining amount sensor 8 detects a sheet (not shown), and a sheet size sensor 9 detects a size of the sheet. A sheet transport motor (PM) 5 is rotatable in both directions through a driver 4. First, the sheet transport motor 5 rotates in a reverse direction to transport the sheet for a specific distance until a sheet inlet sensor 6 detects the sheet. Then, the sheet transport motor 5 rotates in a forward direction to transport the sheet to a print mechanism inside the electro-photography printer.

In the embodiment, when the sheet reaches a printable position, the print control unit 1 sends a timing signal SG3 (including a main scanning synchronization signal and a sub scanning synchronization signal) to the host device, and receives the video signal SG2. After the host device edits the video signal SG2 per page and sends the video signal SG2 to the print control unit 1, the video signal SG2 is transmitted to the light print head 19 as a print data signal HD-DATA. In the light print head 19, a plurality of light emitting thyristors is arranged in a substantially linear pattern each for printing one dot (pixel).

In the embodiment, the video signal SG2 is sent and received per print line. Information to be printed with the light print head 19 is converted to a static latent image as dots with an increased potential on a photosensitive drum (not shown) charged with a negative potential. In a developing device 27, toner charged with a negative potential is attracted to the dots of the static latent image through an electric attraction, thereby forming a toner image.

In the next step, the toner image is transported to a transfer device 28. A transfer high voltage power source 26 is turned on to a positive potential according to a transfer signal SG4, so that the transfer device 28 transfers the toner image to the sheet passing through between the photosensitive drum and the transfer device 28. After the toner image is transferred to the sheet, the sheet abuts against the fixing device 22 with the heater 22a, so that the toner image is fixed to the sheet through heat of the fixing device 22. After the toner image is fixed to the sheet, the sheet is discharged from the print mechanism to outside the electro-photography printer through a sheet outlet sensor 7.

In the embodiment, according to the detection of the sheet size sensor 9 and the sheet inlet sensor 6, the print control unit 1 controls the transfer high voltage power source 26 to apply a voltage to the transfer device 28 only when the sheet passes through the transfer device 28. After the printing operation is completed and the sheet passes through the sheet outlet sensor 7, the print control unit 1 controls the charge high voltage power source 25 to stop applying a voltage to the developing device 27. At the same time, the print control unit 1 controls the developing transfer process motor 3 to stop, thereby repeating the process described above.

A configuration of the light print head 19 will be explained next. A typical example of the light emitting element includes an LED (Light Emitting Diode) and an LD (Laser Diode). The LED is formed of a semiconductor compound (GaAs, GaP, AlGaAs, InGaAsP, InGaAlAs, and the likes) having a PN junction or a PIN junction. A forward voltage is applied for injecting carriers inside the connection, so that light is emitted through a reconnection process. The LD is formed of the LED having a wave guide portion therein.

When a current flowing in the LD is larger than a threshold current, pairs of electron-holes to be injected increase and become an inverse distribution. Accordingly, an increase (gain) in photo-electrons occurs due to stimulated radiation, so that light returns to an active layer with a parallel reflection mirror such as a cleavage plane, thereby generating laser oscillation. As a result, a laser light is emitted from an end surface of the light guide portion.

Similar to the LED and the LD, there has been known a negative resistor element (a light emitting thyristor, a laser thyristor, and the likes) having a light emitting function. In the embodiment, the light print head 19 includes the light emitting element formed of the light emitting thyristor. The light emitting thyristor is formed of a semiconductor compound having a PNPN junction. With silicon, a thyristor or an SCR (Silicon Controlled Rectifier) has been developed.

A configuration of the light print head 19 will be explained in more detail. FIG. 2 is a circuit diagram showing the configuration of the light print head 19 according to the first embodiment of the present invention. As shown in FIG. 2, the light print head 19 includes eight light emitting elements as a simple representation. In an actual case, when the light print head 19 is capable of printing on an A4 size sheet at a resolution of 600 dots per one inch, the light print head 19 includes 4,992 of the light emitting elements. Accordingly, the circuit diagram having the configuration shown in FIG. 2 is arranged in 4,992 of stages as a whole.

As shown in FIG. 2, the light print head 19 includes a shift register 30 represented with a hidden line, and the shift register 30 includes flip-flop circuits 31 to 38. Further, the light print head 19 includes the light emitting thyristors d1 to d8 each having three terminals, i.e., an anode terminal, a cathode terminal, and a gate terminal. An anode drive circuit 40 is provided for driving the light emitting thyristors d1 to d8. The anode drive circuit 40 is preferably disposed inside the print control unit 1, and may be disposed inside the light print head 19. In the embodiment, the anode drive circuit 40 is disposed inside the light print head 19.

In the embodiment, the shift register 30 has a serial data input terminal SI and a clock terminal SCK. The anode drive circuit 40 has a data terminal D connected to the anode terminals of the light emitting thyristors d1 to d8 for supplying an anode current to drive the light emitting thyristors d1 to d8.

In the embodiment, the serial data terminal SI is connected to an input terminal D of the flip-flop circuit 31, and an output terminal Q of the flip-flop circuit 31 is connected to an input terminal D of the flip-flop circuit 32. Further, the output terminal Q of the flip-flop circuit 31 is an output terminal Q1 of the shift register 30 and connected to the gate terminal of the light emitting thyristor d1. Similarly, output terminals Q2 to Q8 are connected to the gate terminals of the light emitting thyristors d2 to d8, respectively. The clock terminal SCK of the shift register 30 is connected to clock terminals of the flip-flop circuits 31 to 38. The cathode terminals of the light emitting thyristors d1 to d8 are connected to ground.

In the anode drive circuit 40, a PMOS transistor 44 and a NMOS transistor 45 constitute an inverter circuit 46. A source terminal of the PMOS transistor 44 is connected to a power source VDD, and a drain terminal of the PMOS transistor 44 is connected to a drain terminal the NMOS transistor 45 and a current regulating circuit 41 (described later). A DRV ON-N terminal is connected to gate terminals of the PMOS transistor 44 and the NMOS transistor 45 for receiving a DRV ON-N signal for instructing an on-off timing of the light emitting thyristors d1 to d8.

As shown in FIG. 2, the current regulating circuit 41 represented with a hidden line includes a constant current diode 42 such as a CRD series (a product of Ishizuka Electronics Corporation), and a silicon small signal diode 43, preferably a Schottky barrier diode, thereby obtaining a good property. An anode terminal of the constant current diode 42 is connected to the drain terminals of the PMOS transistor 44 and the NMOS transistor 45, and further to a cathode terminal of the diode 43. A cathode terminal of the constant current diode 42 is connected to an anode terminal of the diode 43, and further to the anode terminals (data terminals D) of the light emitting thyristor d1 to d8.

When the DRV ON-N signal is at a high level, an output of the inverter circuit 46 formed of the PMOS transistor 44 and the NMOS transistor 45 is at a low level, and the data terminal D is also at a low level mainly due to an operation of the diode 43. When the diode 43 is the Schottky barrier diode, it is possible to sufficiently reduce a forward voltage thereof. Accordingly, an output of the data terminal D becomes substantially zero V, and an anode terminal current IOUT2 of the light emitting thyristors d1 to d8 becomes zero, so that the light emitting thyristors d1 to d8 do not emit light.

When the DRV ON-N signal is at a low level, an output of the inverter circuit 46 formed of the PMOS transistor 44 and the NMOS transistor 45 is at a high level. Accordingly, the anode terminal current IOUT2 flows from the data terminal D to the anode terminals of the light emitting thyristors d1 to d8 through the constant current diode 42. As a result, elements instructed to emit light among the light emitting thyristors d1 to d8 do emit light.

Figure 3A:
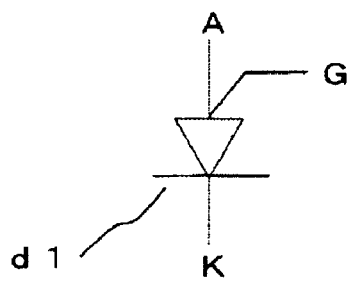
Figure 3B:
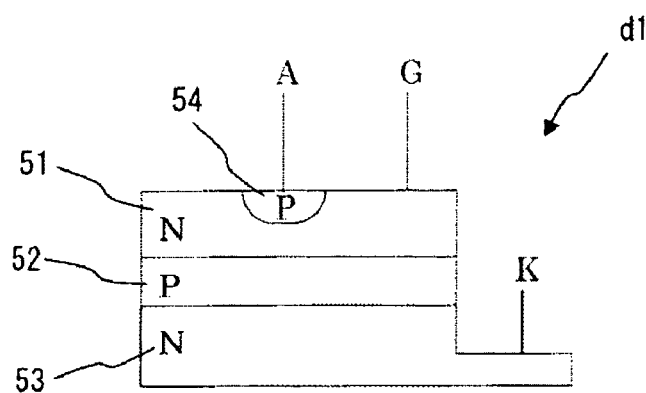

FIGS. 3(a) to 3(d) are views showing a configuration of the light emitting thyristor d1 according to the first embodiment of the present invention. FIG. 3(a) is a circuit diagram of the light emitting thyristor d1 having the anode terminal A, the cathode terminal K, and the gate terminal G. Further, FIG. 3(b) is a sectional view of the light emitting thyristor d1. In the embodiment, the light emitting thyristor d1 uses a GaAs wafer substrate, and a specific crystal is epitaxially grown on an upper layer of the GaAs wafer substrate with a well-known MO-CVD (Metal Organic Chemical Vapor Deposition) method.

More specifically, after a specific buffer layer and a sacrifice layer (not shown) are epitaxially grown, an N-type layer 53 containing an N-type impurity, a P-type layer 52 containing a P-type impurity, and an N-type layer 51 containing an N-type impurity are sequentially laminated on an AlGaAs substrate, thereby forming a wafer having an NPN three-layer structure. Then, a P-type impurity region 54 is selectively formed in the N-type layer 51, i.e., the uppermost layer of the light emitting thyristor d1, with a well-known photolithography.

In the next step, a groove portion is formed with a well-known dry etching method for separating an element. Then, the N-type layer 53, i.e., the lowermost layer of the light emitting thyristor d1, is partially exposed with the well-known dry etching method to form a metal wiring portion, thereby forming a cathode electrode. Similarly, an anode electrode and a gate electrode are formed in the P-type region 54 and the N-type layer 51, respectively.

Figure 3C:
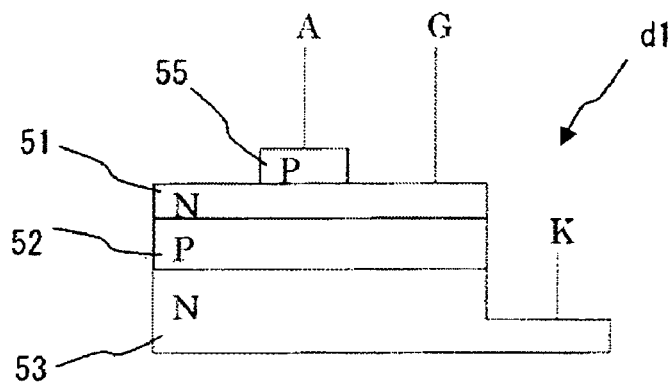

FIG. 3(c) is a sectional view of another configuration of the light emitting thyristor d1. In the embodiment, the light emitting thyristor d1 uses a GaAs wafer substrate, and a specific crystal is epitaxially grown on an upper layer of the GaAs wafer substrate with a well-known MO-CVD (Metal Organic Chemical Vapor Deposition) method.

More specifically, after a specific buffer layer and a sacrifice layer (not shown) are epitaxially grown, the N-type layer 53 containing the N-type impurity, the P-type layer 52 containing the P-type impurity, the N-type layer 51 containing the N-type impurity, and a P-type layer 55 containing a P-type impurity are sequentially laminated on an AlGaAs substrate, thereby forming a wafer having an PNPN three-layer structure.

In the next step, a groove portion is formed with a well-known dry etching method for separating an element. Then, the N-type layer 53, i.e., the lowermost layer of the light emitting thyristor d1, is partially exposed with the well-known dry etching method to form a metal wiring portion, thereby forming a cathode electrode. Further, the P-type layer 55, i.e., the uppermost layer of the light emitting thyristor d1, is partially exposed with the well-known dry etching method to form a metal wiring portion, thereby forming an anode electrode. Similarly, a gate electrode is formed in the N-type layer 51.

Figure 3D:
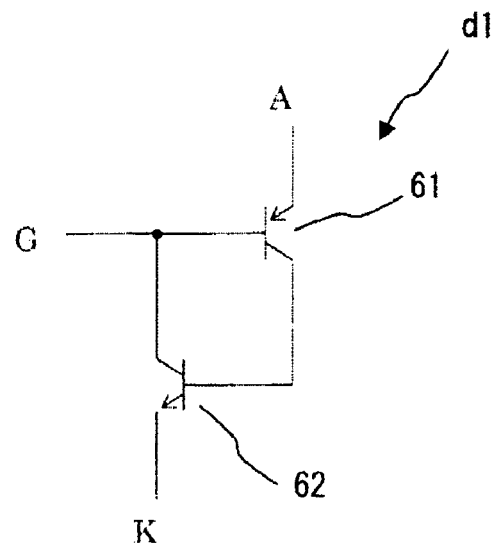

FIG. 3(d) is a circuit diagram of the light emitting thyristor d1 shown in FIG. 3(c). The light emitting thyristor d1 is formed of a PNP transistor 61 and an NPN transistor 62. An emitter terminal of the PNP transistor 61 corresponds to the anode terminal A of the light emitting thyristor d1. A base terminal of the PNP transistor 61 corresponds to the gate terminal G of the light emitting thyristor d1, and is connected to a collector terminal of the NPN transistor 62. Further, a collector terminal of the PNP transistor 61 is connected to a base terminal of the NON transistor 62. An emitter terminal of the NPN transistor 62 corresponds to the cathode terminal K of the light emitting thyristor d1.

In the embodiment, the light emitting thyristor d1 is processed with a method shown, for example, Japanese Patent Publication No. 2007-081081. More specifically, the epitaxially layer having the structures shown in FIGS. 3(b) and 3(c) are peeled off into a film shape with the method disclosed in the above reference. Then, the epitaxial layer is attached to an IC wafer with a shift register integrated thereon with an epitaxial film bonding method, so that the terminals are wired with a photolithography method. At last, the IC wafer is divided into a plurality of chips with a well-known dicing method, thereby forming an integrated chip formed of the light emitting element and the drive element.

Figure 4:
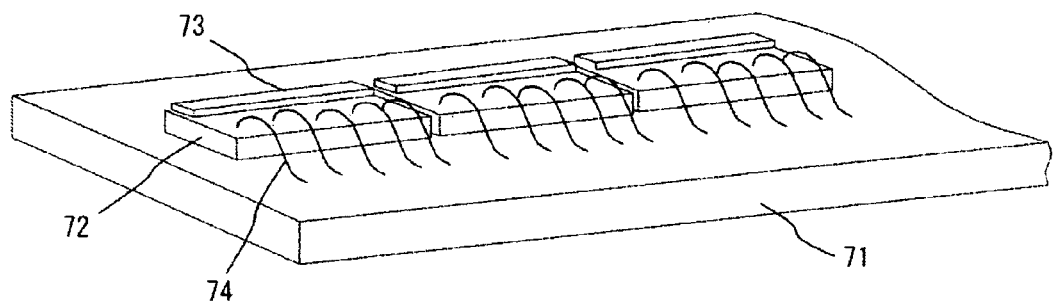
FIG. 4 is a schematic perspective view showing a circuit board unit of the light print head according to the first embodiment of the present invention.

FIG. 4 is a schematic perspective view showing a circuit board unit of the light print head 19 according to the first embodiment of the present invention. In the circuit board unit, the integrated chip formed of the light emitting element and the drive element is arranged on a print circuit board 71.

As shown in FIG. 4, IC chips 72 with the shift register integrated thereon are mounted on the print circuit board 71, and light emitting thyristor arrays 73 are arranged on the IC chips 72. Terminals of the shift registers of the IC chips 72 are connected to wiring pads (not shown) on the print circuit board 71 with bonding wires 74.

Figure 5:
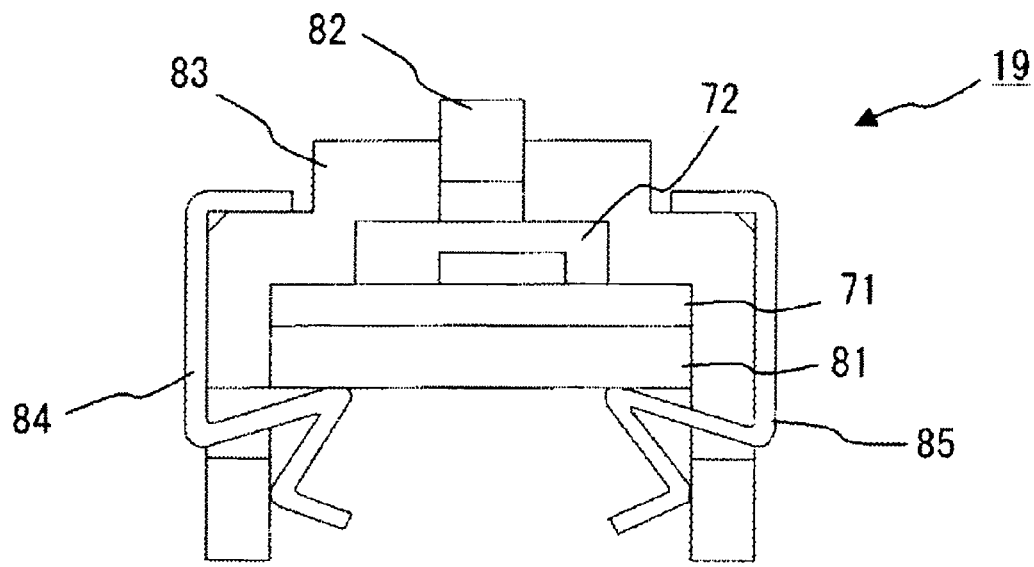
FIG. 5 is a schematic sectional view showing the light print head according to the first embodiment of the present invention.

FIG. 5 is a schematic sectional view showing the light print head 19 according to the first embodiment of the present invention. As shown in FIG. 5, the light print head 19 is formed of a base member 81; the print circuit board 71 fixed to the base member 81; a rod lens array 82 having a plurality of optical elements with a column shape arranged therein; a holder 83 for holding the rod lens array 82; and clamp members 84 and 85 for fixing the print circuit board 71, the base member 81, and the holder 83.

Figure 6:
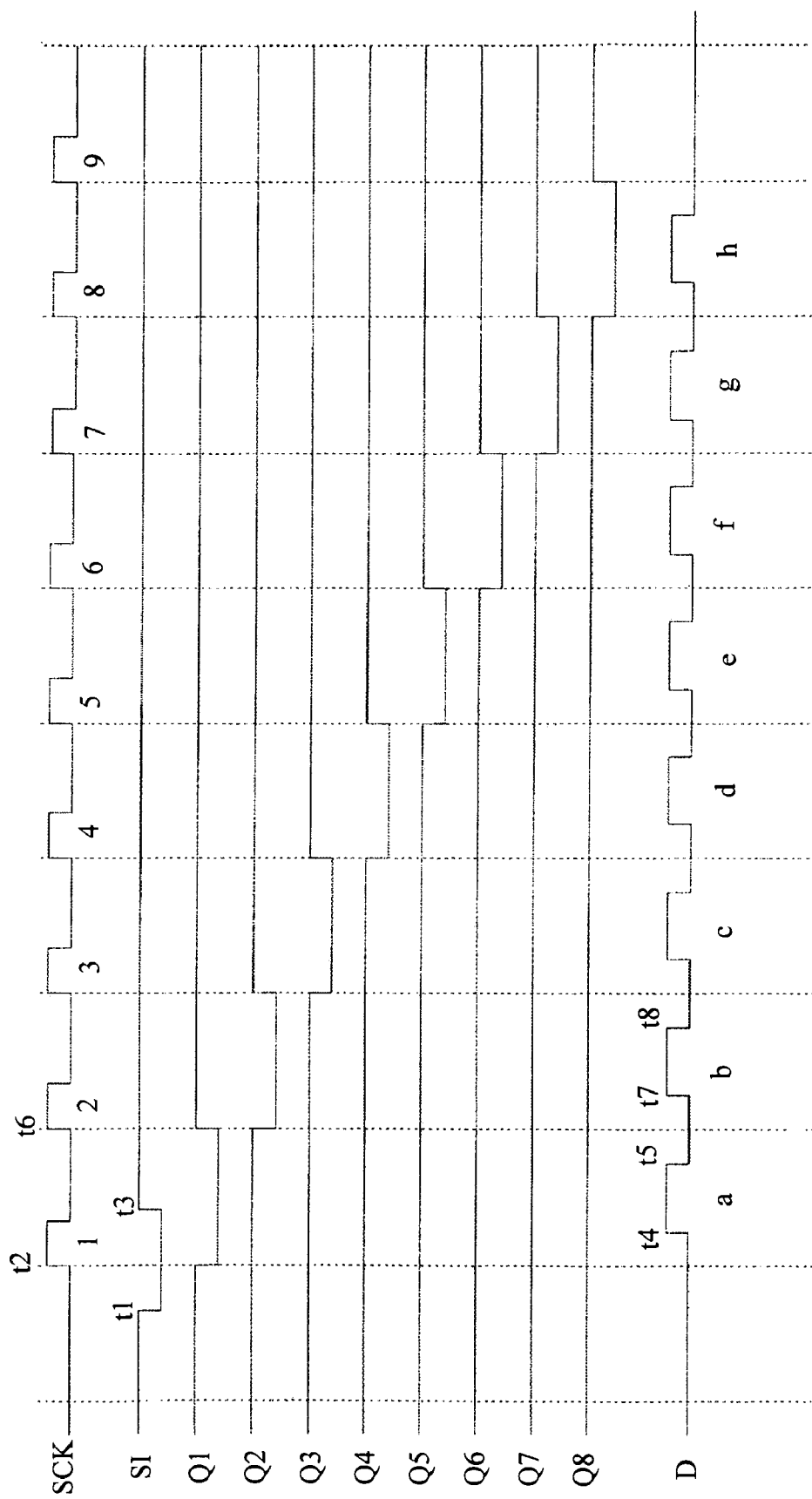
FIG. 6 is a time chart showing an operation of the light print head according to the first embodiment of the present invention.

An operation of the light print head 19 will be explained next. FIG. 6 is a time chart showing an operation of the light print head 19 according to the first embodiment of the present invention. In the operation, one line is scanned when the electro-photography printer performs a printing operation, in which the light emitting thyristor d1 to d8 shown in FIG. 2 sequentially emit light.

Before the operation shown in FIG. 6, a pre-set process is performed on the shift register 30 as a pre-operation (not shown) when the electro-photography printer is turned on. In the pre-set process, the SI terminal shown in FIG. 2 is set to a high level, and clock pluses corresponding to the number of the stages of the shift register 30 are input to the clock terminal SCK. Accordingly, the output terminals Q1 to Q8 of the shift register 30 are at a high level.

In FIGS. 2 and 6, before scanning one line, the shift data input terminal SI is at a low level at a timing t1. At a timing t2, a first pulse is input to the clock terminal SCK. When the SCK signal rises, the SI signal is retrieved to the flip-flop circuit 31 at the first stage of the shift register 30. Slightly afterward, the output terminal Q1 of the flip-flop circuit 31 at the first stage becomes a low level. After the clock signal SCK rises, the shift data input terminal SI returns to a high level at a timing t3.

When the output terminal Q1 becomes the low level, a gate potential of the light emitting thyristor d1 decreases. At a timing t4, a signal of the data input terminal D becomes a high level. Accordingly, a potential difference is generated between the anode terminal and the gate terminal of the light emitting thyristor d1, thereby creating a trigger current to turn on the light emitting thyristor d1 to emit light. A current flows between the anode terminal and the cathode terminal, so that the light emitting thyristor d1 emits light. Accordingly, when a voltage applied between the anode terminal and the cathode terminal becomes zero, the light emitting thyristor d1 stops emitting light. To this end, at a timing t5, the potential of the data input terminal D is set to a low level.

As described above, when a current flows between the anode terminal and the cathode terminal, the light emitting thyristors d1 to d8 emit light. Accordingly, when the drive circuit having the constant current property is provided as the drive source of the data input terminal D shown in FIG. 2, it is possible to maintain the drive current thereof at a constant level even though there is a small variance in the voltage between the anode terminal and the cathode terminal. As a result, even though a power source voltage varies, it is possible to maintain a light emission output at a constant level.

In a conventional drive circuit disclosed in Patent Reference (Japanese Patent Publication No. 2004-195796), a drive circuit is formed of a CMOS buffer and a resistor. Accordingly, a desirable drive current is obtained through regulating a constant voltage output from the buffer circuit with the resistor. In other words, the conventional drive circuit is simply formed of the resistor, instead of the current regulating circuit 41 shown in FIG. 2.

In the conventional drive circuit, an output of the CMOS buffer at a high level is equal to a power source voltage VDD. Accordingly, a drive current Ia flowing in an anode terminal of a thyristor is expressed with the following equation:

$$Ia=(VDD-Va)/R$$

where R is a resistivity of the resistor, and Va is a voltage between the anode terminal and the cathode terminal of the thyristor upon emitting light.

As apparent from the above equation, in the conventional drive circuit, when the power source voltage VDD varies, the drive current Ia directly varies. Patent Reference discloses a configuration, in which the anode terminal of the light emitting thyristor is connected to the power source for driving the cathode terminal. The above equation is applicable to the configuration.

In the embodiment, as shown in FIG. 5, the signal of the data input terminal D becomes the high level at the timing t4 for turning on the light emitting thyristor d1. At the timing t5, the potential of the data input terminal D is set to the low level for turning off the light emitting thyristor d1. When it is not necessary to turn on the light emitting thyristor d1, it is possible to set the data input terminal D at the low level between the timing t4 and the timing t5. As described above, it is possible to switch on and off the light emitting thyristor d1 according to the level of the data input terminal D.

At a timing t6, the clock signal SCK rises. At this time, the shift data input terminal SI is at the high level. Accordingly, slightly afterward, the output terminal Q1 becomes a high level, and the output terminal Q2 becomes a low level.

At a timing t7, a signal of the data input terminal D becomes the high level. Accordingly, a potential difference is generated between the anode terminal and the gate terminal of the light emitting thyristor d2, thereby creating a trigger current to turn on the light emitting thyristor d2 to emit light. A current flows between the anode terminal and the cathode terminal, so that the light emitting thyristor d2 emits light. Accordingly, when a voltage applied between the anode terminal and the cathode terminal becomes zero, the light emitting thyristor d1 stops emitting light. To this end, at a timing t8, the potential of the data input terminal D is set to the low level.

As described above, when each of the clock signals SCK 1 to 8 shown in FIG. 6 rises, the output of each of the output terminals Q1 to Q8 sequentially becomes the low level while other outputs are at the high level. Accordingly, when the data input terminal D is at the high level, among the output terminals Q1 to Q8 of the light emitting thyristors d1 to d8, only the light emitting thyristor with the output terminal at the low level emits light.

Further, when the potential difference is generated between the anode terminal and the gate terminal of the light emitting thyristor to bias in the forward direction, and the anode current is supplied, the light emitting thyristor is turned on. When the potential difference is generated between the anode terminal and the gate terminal is less than a forward direction voltage, the light emitting thyristor is maintained off. Accordingly, it is possible to set the potential difference to zero, or to apply a voltage in an opposite direction.

Figure 7A:
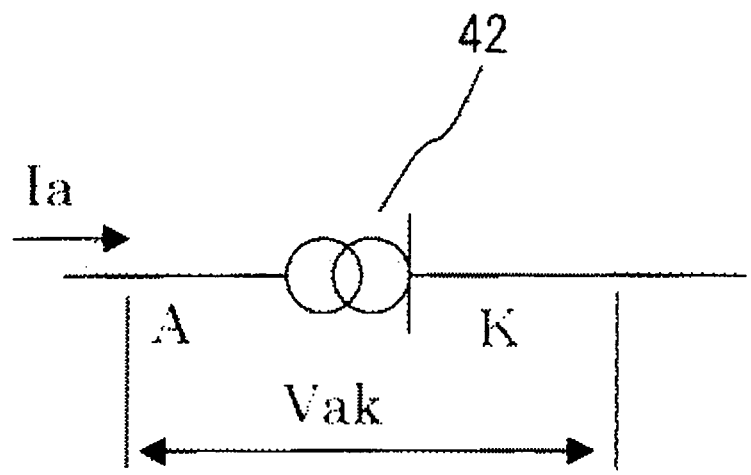

FIGS. 7(*a*) and 7(*b*) are views showing an operation of the anode drive circuit 40 according to the first embodiment of the present invention. FIG. 7(*a*) is a circuit diagram of the anode drive circuit 40 or the constant current diode 42. As shown in FIG. 7(*a*), the constant current diode 42 includes an anode terminal A, a cathode terminal K. An anode-cathode voltage Vak is applied between the anode terminal A and the cathode terminal K, so that an anode current Ia flows therein.

Figure 7B:
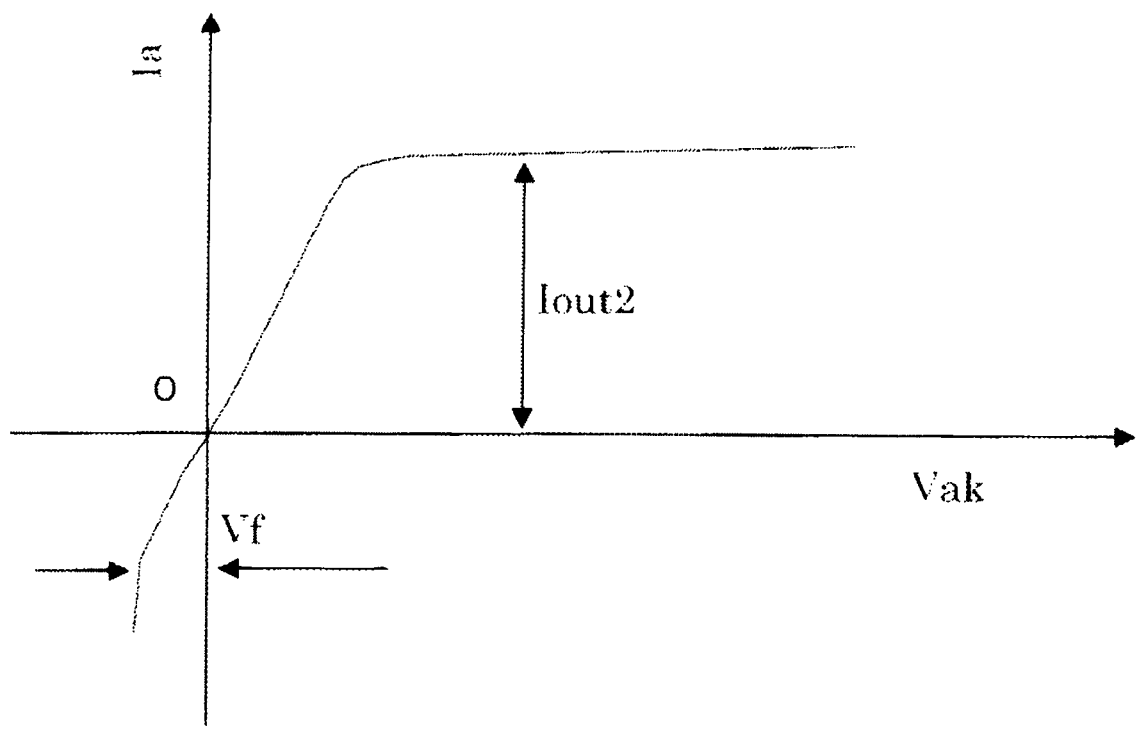

FIG. 7(*b*) is a graph of the operation of the anode drive circuit 40 or the constant current diode 42. In the graph, the vertical axis represents the anode current Ia, and the horizontal axis represents the anode-cathode voltage Vak. As shown in FIG. 7(*b*), when an opposite voltage greater than a specific voltage Vf (about 0.6 V) is applied between the anode shown in FIG. 7(b), when an opposite voltage greater than a specific voltage Vf (about 0.6 V) is applied between the anode terminal A and the cathode terminal K, a large current flows. When a voltage in the forward direction is applied between the anode terminal A and the cathode terminal K, a current Iout2 flows. The current Iout2 is a constant current regardless of the anode-cathode voltage Vak applied between the anode terminal A and the cathode terminal K, thereby providing a constant current property.

Figure 8A:
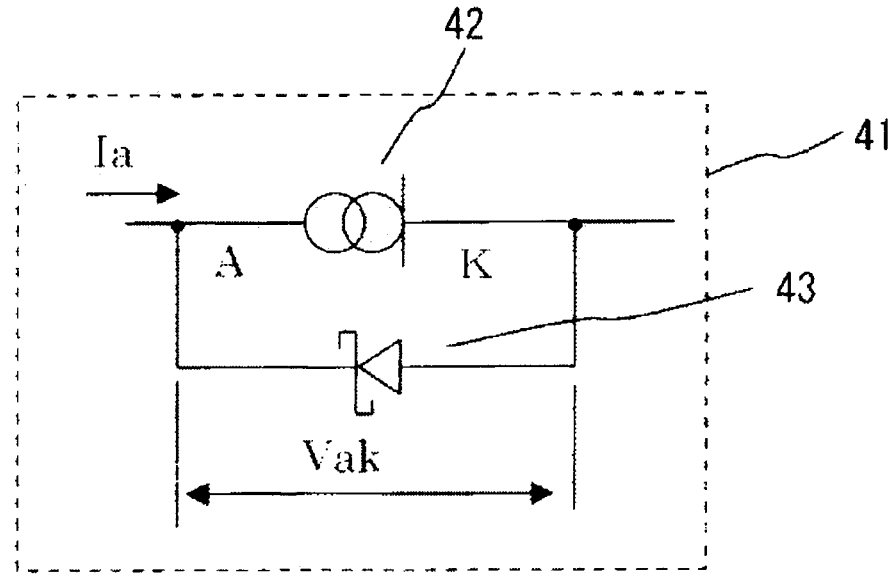
Figure 8B:
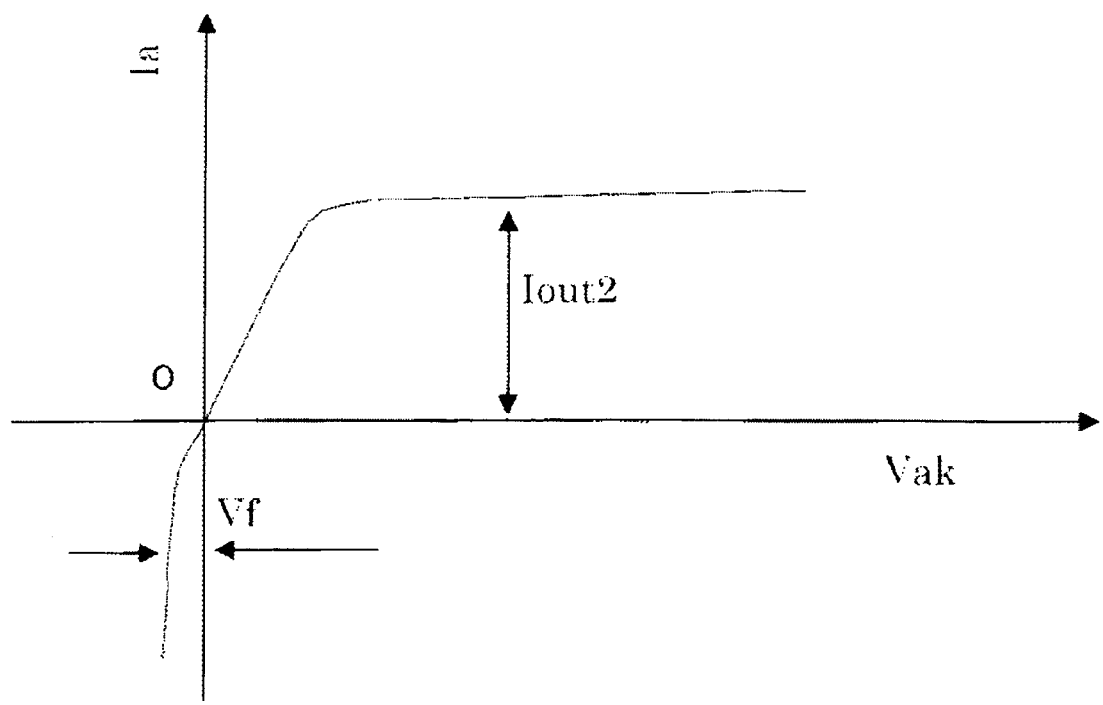

FIGS. 8(a) and 8(b) are views showing the operation of the anode drive circuit 40 according to the first embodiment of the present invention. FIG. 8(a) is a circuit diagram of the anode drive circuit 40 or the current regulating circuit 4 shown in FIG. 2. As shown in FIG. 8(a), the current regulating circuit 4 includes the constant current diode 42 and the diode 43 connected in parallel in an opposite direction.

FIG. 8(b) is a graph of the operation of the anode drive circuit 40 or the current regulating circuit 4. In the graph, the vertical axis represents the anode current Ia, and the horizontal axis represents the anode-cathode voltage Vak. As shown in FIG. 8(b), when an voltage greater than a specific voltage Vf is applied, a large current flows. In this case, the specific voltage Vf is due to a forward direction property of the diode 43, and has a voltage of about 0.2 V, i.e., negligibly smaller than the specific voltage Vf (about 0.6 V) shown in FIG. 7(b). When a voltage in the forward direction is applied between the anode terminal A and the cathode terminal K, the current Iout2 flows. The current Iout2 is a constant current regardless of the anode-cathode voltage Vak applied between the anode terminal A and the cathode terminal K, thereby providing the constant current property.

Figure 9:
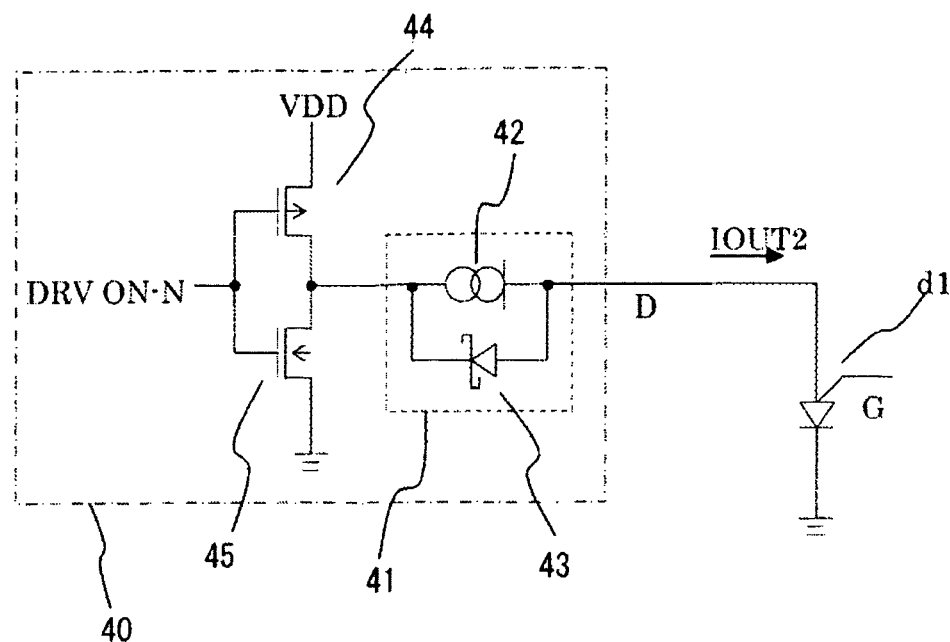
FIG. 9 is a circuit diagram showing the operation of the anode drive circuit according to the first embodiment of the present invention.

FIG. 9 is a circuit diagram showing the operation of the anode drive circuit 40 according to the first embodiment of the present invention. In FIG. 9, one element of the light emitting thyristors d1 to d8 is presented from the circuit diagram shown in FIG. 2. More specifically, the light emitting thyristor d1 and the anode drive circuit 40 are shown in FIG. 9, and the anode current IOUT2 flows in an arrow direction.

Figure 10:
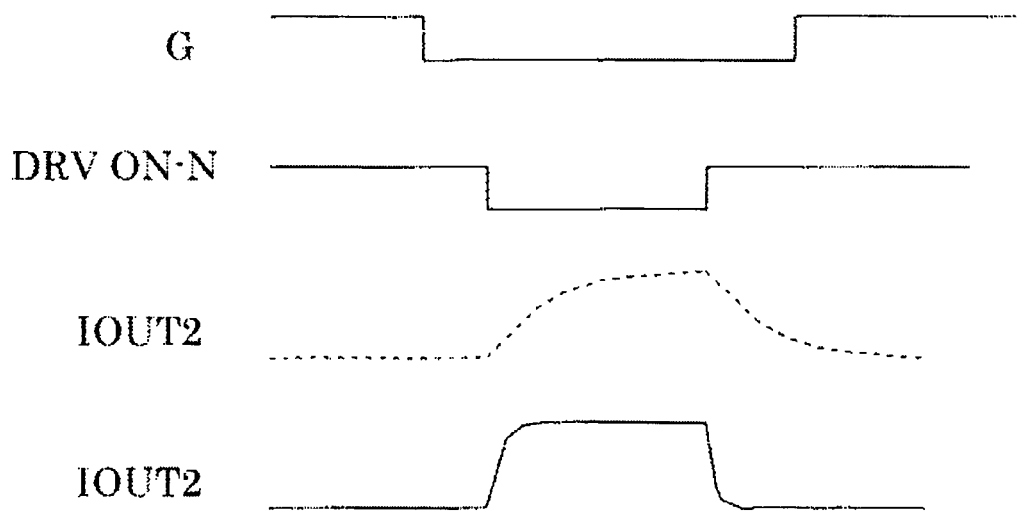
FIG. 10 is a time chart showing the operation of the anode drive circuit according to the first embodiment of the present invention.

FIG. 10 is a time chart showing the operation of the anode drive circuit 40 according to the first embodiment of the present invention. As shown in FIG. 10, the light emitting thyristor d1 has a gate terminal waveform G, and the anode drive circuit 40 (having the configuration shown in FIG. 9) has the anode current IOUT2 represented with a solid line. For comparison, the conventional anode drive circuit (disclosed in Patent Reference) with the resistor as the current regulating element has the anode current IOUT2 represented with a hidden line.

As described above with reference to FIG. 6, when the light emitting thyristor d1 is driven, the gate terminal thereof is set at the low level. Then, the print control unit 1 sends the DRV ON-N signal, i.e., a drive on instruction signal, to the anode drive circuit 40 shown in FIG. 9. When the DRV ON-N signal becomes the low level, the PMOS transistor 44 is turned on and the NMOS transistor 45 is turned off. Accordingly, a voltage equal to the power source voltage VDD is applied to the anode terminal of the constant current diode 42. As a result, the anode current IOUT2 flows through the constant current diode 42.

In the anode drive circuit 40 shown in FIG. 9, the PMOS transistor 44 and the NMOS transistor 45 constitute a CMOS buffer. An output voltage of the CMOS buffer formed at the high level is equal to the power source voltage VDD. Accordingly, the output voltage VDD is expressed with the following equation:

$$VDD = Vak + Va$$

$$Vak = VDD - Va$$

where Vak is the forward voltage of the constant current diode 42, and Va is a voltage between the anode terminal and the cathode terminal of the light emitting thyristor upon emitting light.

As shown in the above equation, when the power source voltage VDD varies, or the voltage Va between the anode terminal and the cathode terminal upon emitting light varies due to a manufacturing variance in the light emitting thyristor, the forward voltage Vak applied to the constant current diode 42 varies. However, as shown in FIG. 8(b), even when the forward voltage Vak varies, an influence thereof on the anode current IOUT2 is minimum. Accordingly, the anode current IOUT2 of the light emitting thyristor d1 is not significantly affected, and a light emission output of the light emitting thyristor d1 is maintained at a constant level.

As shown in FIG. 10, as opposed to the anode current IOUT2 of the conventional anode drive circuit represented with the hidden line, the anode current IOUT2 of the anode drive circuit 40 presented with the solid line shows a short rise time and a short fall time. Accordingly, when the anode drive circuit 40 is applied to an LED head necessary for switching on and off repeatedly, it is possible to increase an operation speed thereof.

As described above, in the embodiment, the constant current diode 42 is provided as the current regulating circuit of the drive circuit of the light emitting thyristors. Accordingly, when the power source voltage VDD varies, or the voltage Va between the anode terminal and the cathode terminal upon emitting light varies due to a manufacturing variance in the light emitting thyristor, it is possible to minimize the influence on the drive current. Accordingly, a light emission output of the light emitting thyristor is maintained at a constant level. Further, the drive current shows a short rise time and a short fall time, thereby making it possible to increase an operation speed thereof.

Modified Configuration of First Embodiment

Figure 11:
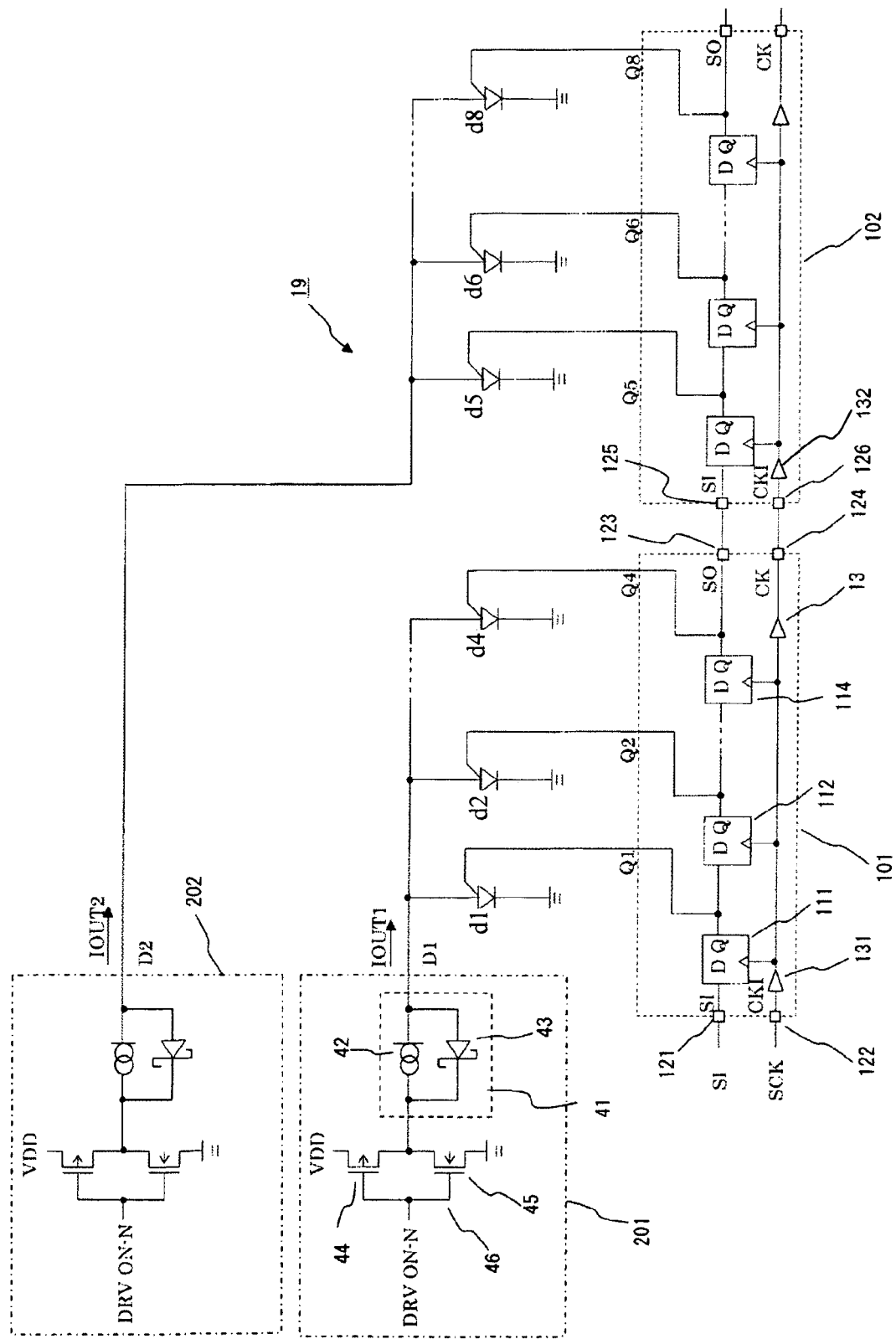
FIG. 11 is a circuit diagram showing a modified configuration of the light print head according to the first embodiment of the present invention.

A modified configuration of the first embodiment will be explained next. FIG. 11 is a circuit diagram showing the modified configuration of the light print head 19 according to the first embodiment of the present invention. In the light print head 19 in the modified configuration, the light emitting thyristor is formed of a plurality of semiconductor chips. It is configured that the semiconductor chips are simultaneously operated in parallel, thereby increasing an operation speed.

As shown in FIG. 11, the light print head 19 includes eight of the light emitting thyristors d1 to d8 as light emitting elements for simple representation. In an actual case, when the light print head 19 is capable of printing on an A4 size sheet at a resolution of 600 dots per one inch, the light print head 19 includes 4,992 of the light emitting elements. Accordingly, the circuit diagram having the configuration shown in FIG. 11 is arranged in 4,992 of stages as a whole.

As shown in FIG. 11, the light print head 19 includes anode drive circuits 201 and 202, and shift register circuits 101 and 102. In FIG. 11, the shift register 101 has four output terminals Q1 to Q4 for simple representation. In an actual case, each of the shift register circuits 101 and 102 has 192 of output terminals. Further, 26 of the shift register circuits having a configuration the same as that of the shift register circuit 101 are connected in cascade, thereby providing a total of 4,992 (=192×26) of the output terminals. The output terminals are connected to the gate terminals of the light emitting thyristors, thereby making it possible to drive and control a total of 4,992 of the light emitting thyristors.

As shown in FIG. 11, the light print head 19 includes flip-flop circuits 111 to 114 and buffer circuits 131 and 132. The shift register 101 has an input terminal 121 connected to the serial data signal SI and further connected to a terminal D of the flip-flop circuit 111. The shift register 101 also has a clock input terminal 122 connected to an input terminal of the buffer circuit 131 for inputting the serial clock signal SCK. The shift register 101 also has a serial data output terminal 123 or SO connected to an output terminal Q of the flip-flop circuit 114 through a buffer circuit (not shown). The shift register 101 also has a serial clock output terminal 124 or CK connected to an output terminal of the buffer circuit 132.

In the embodiment, an output terminal of the buffer circuit 131 is connected to clock terminals of the flip-flop circuits 111 to 114, and further connected to an input terminal of the buffer circuit 132. The output signal terminals (the serial data output terminal SO, the serial clock output terminal CK) of the shift register circuit 101 are connected to the input terminals (the serial data input terminal SI, the serial clock input terminal CKI) of the shift register circuit 102 through a wiring pattern of a print circuit board or a bonding wire.

In the embodiment, the shift register 101 controls the light emitting thyristors d1 to d4 shown in FIG. 11 to emit light. The anode terminals of the light emitting thyristors d1 to d4 are connected to a data terminal D1 of the anode drive circuit 201. The shift register 102 controls the light emitting thyristors d5 to d8 shown in FIG. 11 to emit light. The anode terminals of the light emitting thyristors d5 to d8 are connected to a data terminal D2 of the anode drive circuit 202. The anode drive circuit 202 has a configuration the same as that of the anode drive circuit 201.

Similarly, the light emitting arrays and the shift registers omitted in FIG. 11 are connected to corresponding anode drive circuits (not shown). As described above, in the actual case, each of the shift registers 101 and 102 has 192 of the output terminals and corresponding light emitting thyristor array. Anode terminals of the light emitting thyristor array are connected to the anode drive circuit described above. Accordingly, 26 of the anode drive circuits are simultaneously operated in parallel, thereby performing an exposure process of the printer for one line.

Figure 12:
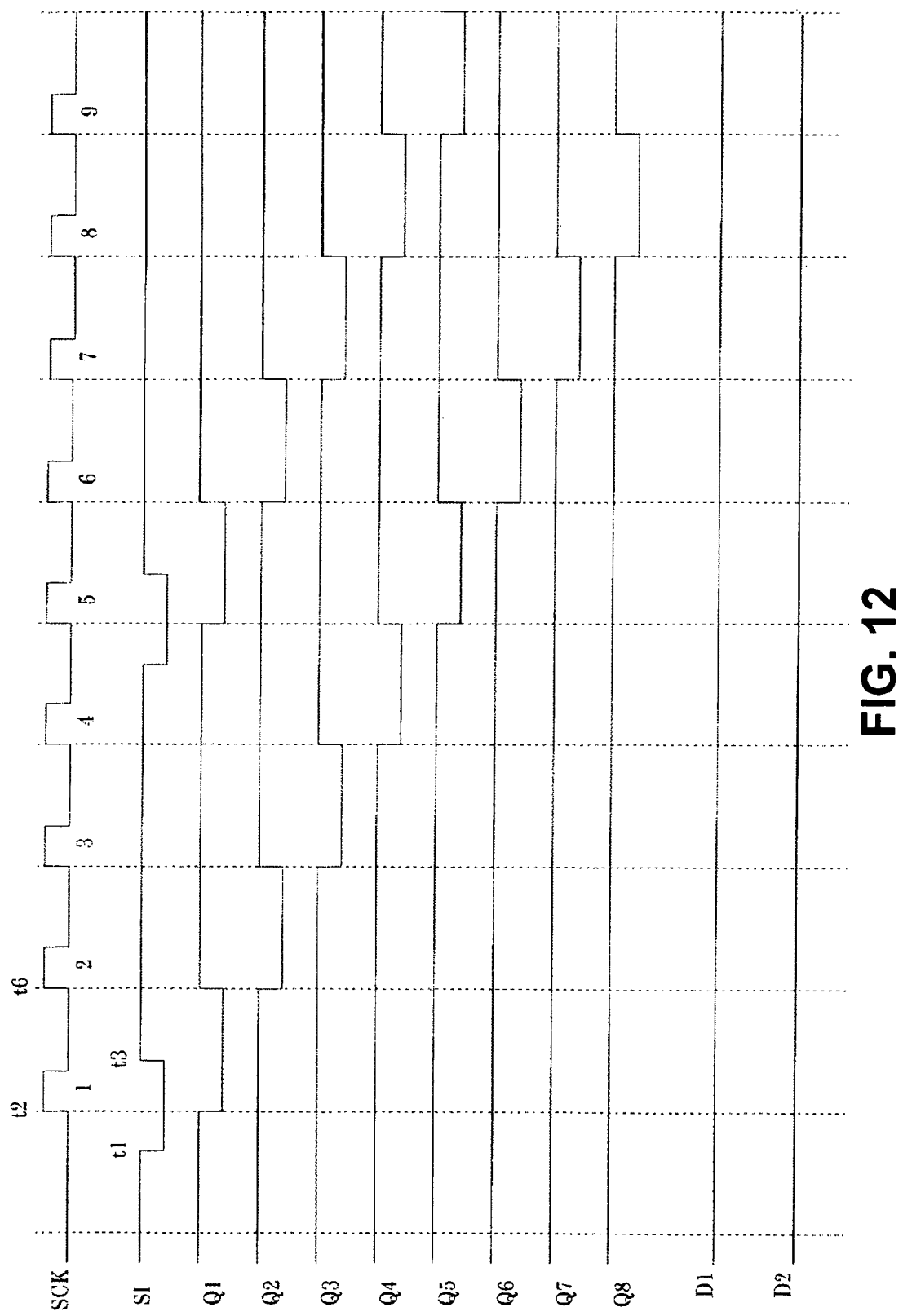
FIG. 12 is a time chart No. 1 showing an operation of the electro-photography printer with the modified configuration according to the first embodiment of the present invention.
Figure 13:
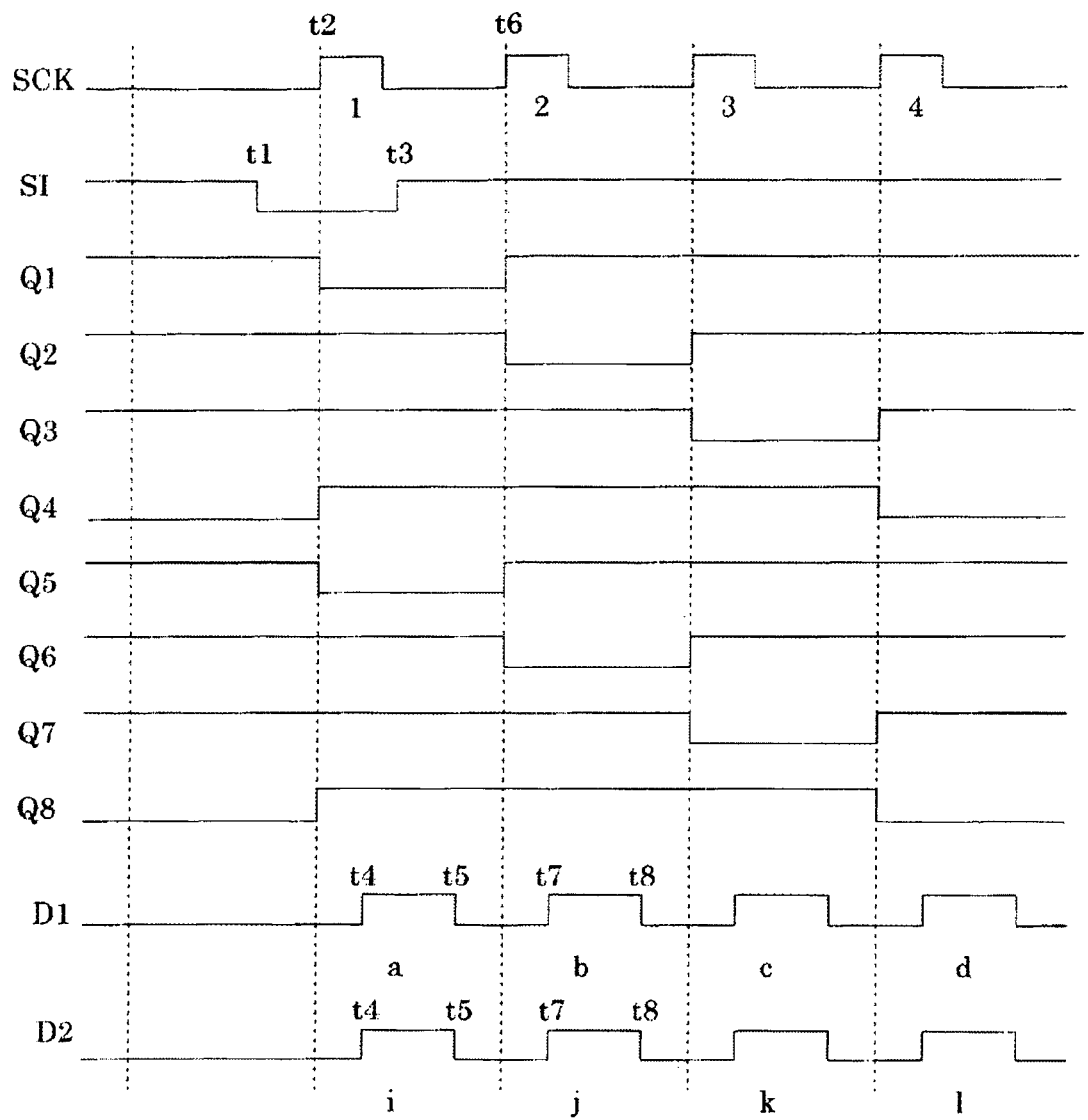
FIG. 13 is a time chart No. 2 showing the operation of the electro-photography printer with the modified configuration according to the first embodiment of the present invention.

FIG. 12 is a time chart No. 1 showing an operation of the electro-photography printer with the modified configuration according to the first embodiment of the present invention. FIG. 13 is a time chart No. 2 showing the operation of the electro-photography printer with the modified configuration according to the first embodiment of the present invention.

In FIG. 12, the electro-photography printer scans one line during the printing operation thereof. In the operation, the groups of the light emitting thyristors d1 to d4 and d5 to d8 emit sequentially light. Further, in FIG. 12, the electro-photography printer performs a preset process of the shift registers as a preparation process when the electro-photography printer is tuned on.

In the embodiment, the shift data input terminal SI is at a low level at a timing t1. At a timing t2, a clock pulse (a first pulse) is input to the clock terminal SCK. At a timing t3, the shift data input terminal SI returns to a high level. At a timing t6, clock pulses (second to fourth pulse) are input to the clock terminal SCK, so that a total number of the pulses is equal to the number of the stages of the shift registers. Accordingly, the output terminals Q1 to Q4 of the shift register 101 become a high level, a high level, a high level, and a low level, respectively.

FIG. 13 is the time chart showing the operation of the light emitting thyristors driven for scanning after the operation shown in FIG. 12. When the operation shown in FIG. 13 is performed, the preset process shown in FIG. 12 is completed. Accordingly, the output terminals Q1 to Q4 of the shift register 101 become the high level, the high level, the high level, and the low level, respectively. Further, the output terminals Q5 to Q8 of the shift register 102 become a high level, a high level, a high level, and a low level, respectively.

As shown in FIG. 13, before one line is scanned, the shift data input terminal SI is at the low level at a timing t1. At a timing t2, a first pulse is input to the clock terminal SCK. When the SCK signal rises, the SI signal is retrieved to the flip-flop circuit 111 at the first stage of the shift register. Slightly afterward, the output terminal Q1 of the flip-flop circuit 111 at the first stage becomes a low level.

Similarly, the output terminal Q5 of the flip-flop circuit at the fifth stage becomes a low level. Accordingly, the output terminals Q1 to Q4 of the shift register 101 become the low level, the high level, the high level, and the high level, respectively. Further, the output terminals Q5 to Q8 of the shift register 102 become the low level, the high level, the high level, and the high level, respectively. After the clock signal SCK rises, the shift data input terminal SI returns to a high level at a timing t3.

When the output terminals Q1 and Q5 becomes the low level, a gate potential of the light emitting thyristors d1 and d5 shown in FIG. 11 decreases. At a timing t4, a signal of the data input terminal D1 becomes a high level (at a point a). At the substantially same time, a signal of the data input terminal D2 becomes a high level (at a point i). Accordingly, a potential difference is generated between the anode terminals and the gate terminals of the light emitting thyristors d1 and d5, thereby creating a trigger current to turn on the light emitting thyristors d1 and d5 to emit light.

A current flows between the anode terminals and the cathode terminals, so that the light emitting thyristors d1 and d5 emit light. Accordingly, a voltage applied between the anode terminal and the cathode terminal becomes zero, the light emitting thyristors d1 and d5 stop emitting light. To this end, at a timing t5, the potential of the data input terminals D1 and D5 is set to a low level.

As described above, when a current flows between the anode terminal and the cathode terminal, the light emitting thyristors d1 to d8 emit light. Accordingly, when a drive circuit having a constant current property such as the anode drive circuits shown in FIG. 11 is provided, it is possible to maintain a drive current thereof at a constant level even though there is a small variance in the voltage between the anode terminal and the cathode terminal. As a result, even though a power source voltage varies, it is possible to maintain a light emission output at a constant level.

In the embodiment, as shown in FIG. 13, the signals of the data input terminals D1 and D2 become the high level at the timing t4 for turning on the light emitting thyristors d1 and d5. At the timing t5, the signals of the data input terminals D1 and D2 are set to the low level for turning off the light emitting thyristors d1 and d5. When it is not necessary to turn on the light emitting thyristor d1, it is possible to set the data input terminal D1 at the low level between the timing t4 and the timing t5. When it is not necessary to turn on the light emitting thyristor d5, it is possible to set the data input terminal D2 at the low level between the timing t4 and the timing t5. As described above, it is possible to switch on and off the light emitting thyristors d1 and d5 according to the level of the data input terminals D1 and D2.

Similarly, with the second pulse of the SCK signal shown in FIG. 13, the output terminals Q1 to Q4 of the shift register 101 become the high level, the low level, the high level, and the high level, respectively. Further, the output terminals Q5 to Q8 of the shift register 102 become the high level, the low level, the high level, and the high level, respectively. At a timing t7, the data input terminals D1 and D2 become a high level (at a point b and a point j). Accordingly, a potential difference is generated between the anode terminals and the gate terminals of the light emitting thyristors d2 and d6, thereby creating a trigger current to turn on the light emitting thyristors d2 and d6 to emit light.

When the process described above is repeated to complete the operation for the fourth pulse of the SCK signal and the drive control of the light emitting thyristors d1 to d8 with the data signals D1 and D2, the light emission of the light emitting thyristors d1 to d8 is completed. At this moment, the output terminals Q1 to Q4 of the shift register 101 become the high level, the high level, the high level, and the low level, respectively. Further, the output terminals Q5 to Q8 of the shift register 102 become the high level, the high level, the high level, and the low level, respectively, thereby retuning to the state that the preset process is completed shown in FIG. 12.

When the process shown in FIG. 13 is repeated to scan a subsequent line, it is possible to simultaneously perform the light emission operation of the light emitting thyristors d1 to d8 in parallel.

As described above, in the modified configuration of the first embodiment, in addition to the effect the same as that in the first embodiment, the light emitting thyristor is formed of a plurality of the semiconductor chips. It is configured that the semiconductor chips are simultaneously driven in parallel with a plurality of the drive circuits, thereby further increasing an operation speed as compared with the first embodiment.

Second Embodiment

A second embodiment of the present invention will be explained next. In the second embodiment, the anode drive circuit has a configuration different from that in the first embodiment. In the second embodiment, the light print head 19 has a configuration the same as that in the first embodiment, and an explanation thereof is omitted. Further, the time chart showing the operation of the light print head 19 is the same as that shown in FIG. 6.

Figure 14:
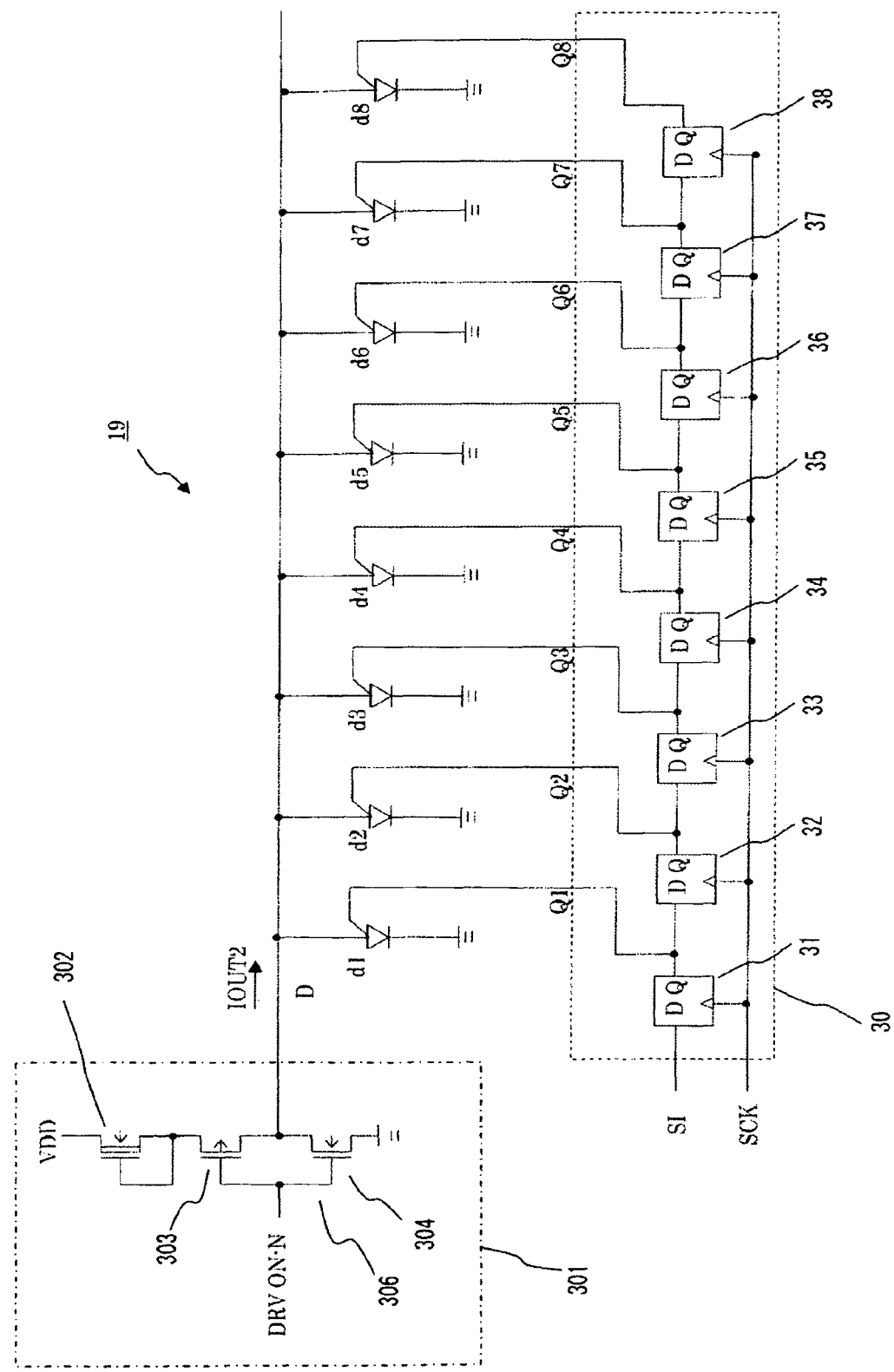
FIG. 14 is a circuit diagram showing a configuration of a light print head according to a second embodiment of the present invention.

FIG. 14 is a circuit diagram showing the configuration of the light print head 19 according to the second embodiment of the present invention. As shown in FIG. 14, the light print head 19 includes eight light emitting elements as a simple representation. In an actual case, when the light print head 19 is capable of printing on an A4 size sheet at a resolution of 600 dots per one inch, the light print head 19 includes 4,992 of the light emitting elements. Accordingly, the circuit diagram having the configuration shown in FIG. 14 is arranged in 4,992 of stages as a whole.

As shown in FIG. 14, the light print head 19 includes the shift register 30 represented with a hidden line, and the shift register 30 includes the flip-flop circuits 31 to 38. Further, the light print head 19 includes the light emitting thyristors d1 to d8 each having the three terminals, i.e., the anode terminal, the cathode terminal, and the gate terminal.

In the embodiment, the shift register 30 has the serial data input terminal SI and the clock terminal SCK. The serial data terminal SI is connected to the input terminal D of the flip-flop circuit 31, and the output terminal Q of the flip-flop circuit 31 is connected to the input terminal D of the flip-flop circuit 32. Further, the output terminal Q of the flip-flop circuit 31 is connected to the gate terminal of the light emitting thyristor d1. Similarly, the output terminals Q2 to Q8 of the shift register 30 are connected to the gate terminals of the light emitting thyristors d2 to d8, respectively. The clock terminal SCK of the shift register 30 is connected to the clock terminals of the flip-flop circuits 31 to 38. The cathode terminals of the light emitting thyristors d1 to d8 are connected to ground.

In the embodiment, an anode drive circuit 301 is provided for driving the light emitting thyristors d1 to d8. The anode drive circuit 301 has a data terminal D connected to the anode terminals of the light emitting thyristors d1 to d8 for supplying an anode current to drive the light emitting thyristors d1 to d8.

In the embodiment, the anode drive circuit 301 includes a PMOS transistor 303 and a NMOS transistor 304. A drain terminal of the PMOS transistor 303 is connected to a drain terminal of the NMOS transistor 304. A source terminal of the NMOS transistor 304 is connected to ground. A gate terminal of the PMOS transistor 303 is connected to a gate terminal of the NMOS transistor 304. The PMOS transistor 303 and the NMOS transistor 304 constitute an inverter circuit 306.

In the embodiment, the inverter circuit 306 receives the DRV ON-N signal from the print control unit (not shown) for instructing on-off of the light emitting thyristors d1 to d8. An output terminal of the inverter circuit 306 (the drain terminal of the PMOS transistor 303) is connected to the anode terminals or the data terminals D of the light emitting thyristors d1 to d8. The anode drive circuit 301 further includes an NMOS depletion type transistor 302. A drain terminal of the NMOS depletion type transistor 302 is connected to the power source VDD, and a gate terminal thereof is connected to the source terminal of the PMOS transistor 303.

Figure 15A:
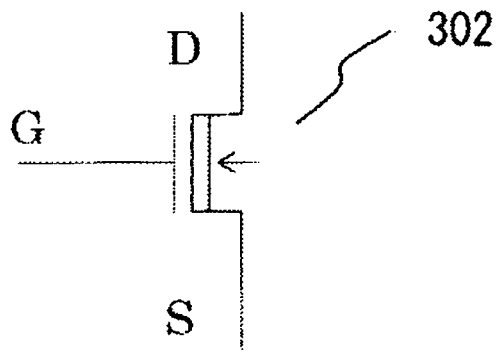
Figure 15B:
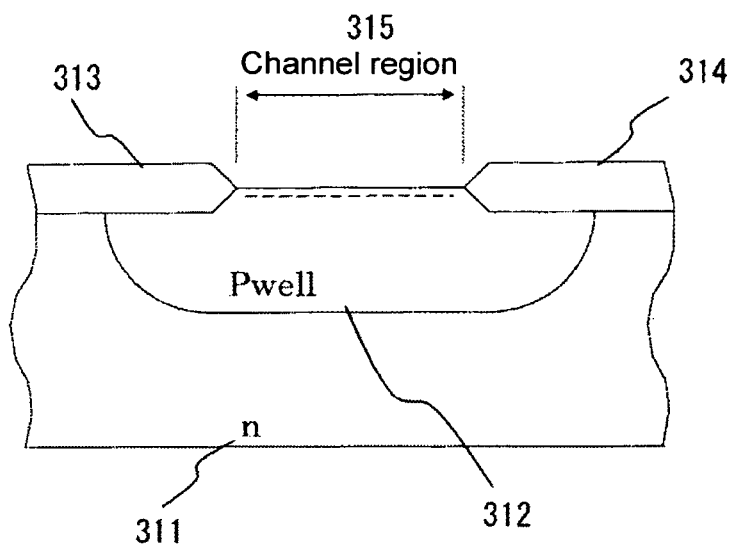
Figure 15C:
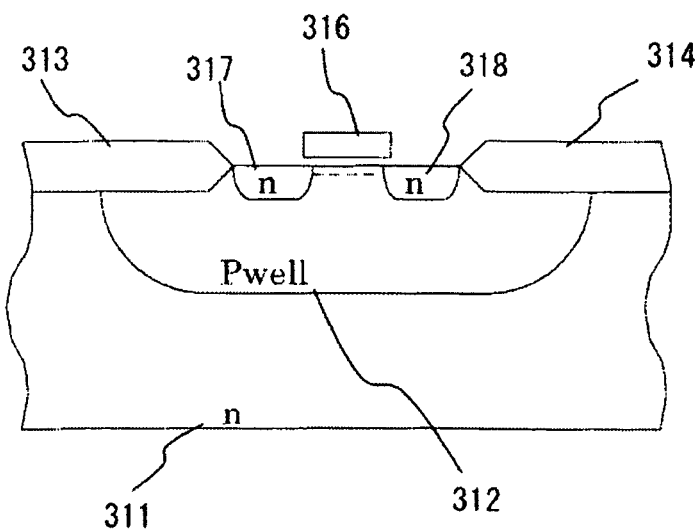

A configuration of the NMOS depletion type transistor 302 will be explained next. FIGS. 15(a) to 15(c) are views showing the configuration of the depletion type transistor 302 according to the second embodiment of the present invention. FIG. 15(a) is a circuit diagram of the depletion type transistor 302. As shown in FIG. 15(a), the NMOS depletion type transistor 302 includes a drain terminal D, a gate terminal G, and a source terminal S.

FIG. 15(b) is a sectional view of the depletion type transistor 302 in a manufacturing process thereof taken along a section crossing the source terminal S and the drain terminal D in a channel direction. As shown in FIG. 15(b), a P-type impurity is implanted in a specific portion of an N-type semiconductor wafer 311 to form a P-well region 312. Then, field oxide films 313 and 314 are formed for separating elements, and an N-type impurity is implanted in a portion of the P-well region 312 not covered with the field oxide films 313 and 314, thereby forming a channel region 315.

FIG. 15(c) is a sectional view of the depletion type transistor 302 in the manufacturing process thereof continued from FIG. 15(b). As shown in FIG. 15(c), an N-type impurity is diffused with a gate portion 316 formed of silicon as a mask, thereby forming a source region 317 and a drain region 318. As described with reference to FIG. 15(c), the N-type impurity is implanted in the shallow portion of the channel region just below the gate portion 316. It is possible to adjust a property of an MOS transistor through a concentration of an impurity or a depth of a layer where an impurity is implanted.

Figure 16A:
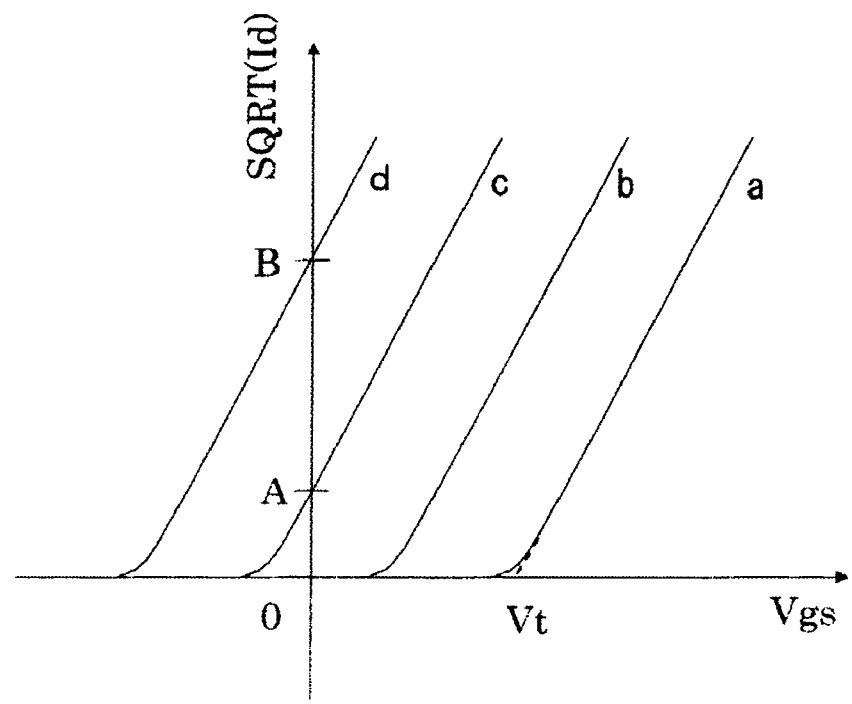
FIGS. 16(a) and 16(b) are graphs showing an operation of the depletion type transistor according to the second embodiment of the present invention.
Figure 16B:
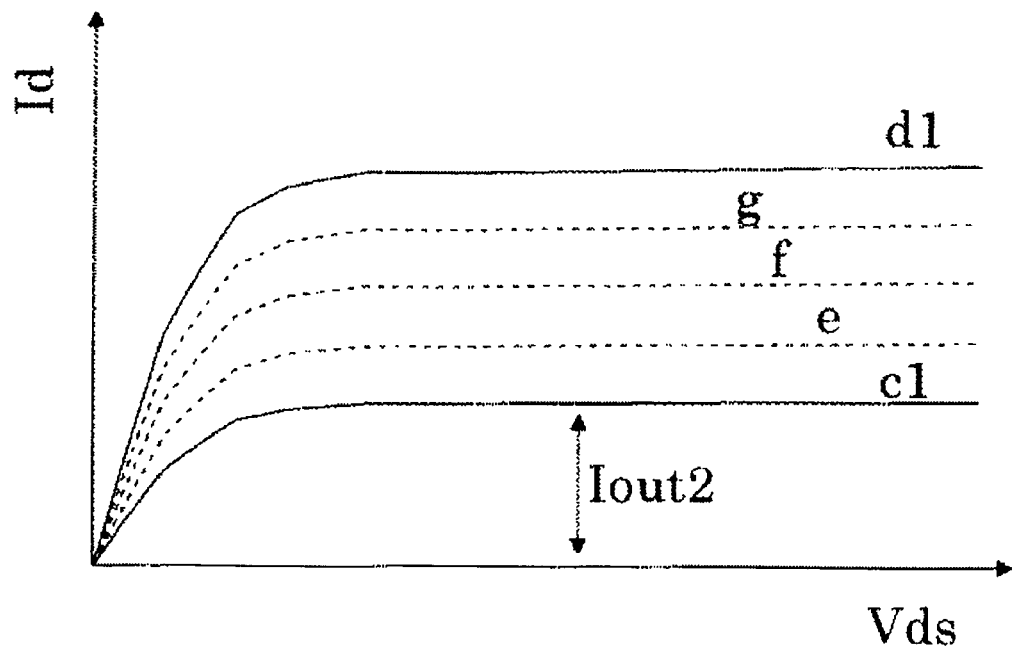

FIGS. 16(a) and 16(b) are graphs showing an operation of the depletion type transistor 302 according to the second embodiment of the present invention. FIG. 16(a) is a graph showing a relationship between a gate voltage and a drain current of the NMOS depletion type transistor 302, in which the horizontal axis represents a voltage between gate-source Vgs and the vertical axis represents a root-square of the drain current SQRT(Id).

As shown in FIG. 16(a), a curve a changes linearly with the voltage between gate-source Vgs. An intersection between a tangent of the curve a and the horizontal axis is a threshold voltage Vt of the NMOS depletion type transistor 302. Note that the curve a represents a case that the impurity is implanted in the channel region with a relatively low amount shown in FIG. 15(c), and is substantially equivalent to a property of a normal NMOS enhancement type transistor.

When an amount of the impurity implanted in the channel region increases, a curve shifts from the curve a to a curve b toward a direction that the threshold voltage Vt decreases. In a case of a curve a or a curve d, the drain current flows even through the voltage between gate-source Vgs becomes zero (points A and B), thereby obtaining a property of the NMOS depletion type transistor 302. In this case, the threshold voltage Vt has a negative value.

FIG. 16(b) is a graph showing a relationship between a drain voltage and the drain current of the NMOS depletion type transistor 302 when the voltage between gate-source Vgs becomes zero. In FIG. 16(b), the horizontal axis represents a voltage between drain-source Vds, and the vertical axis represents the drain current Id.

In FIG. 16(b), a curve c1 corresponds to the curve c shown in FIG. 16(a), and a curve d1 corresponds to the curve d shown in FIG. 16(a). As shown in FIG. 16(b), when the voltage between drain-source Vds is less than a specific level, the drain current Id is constant at Iout2, thereby obtaining the constant current property regardless of the voltage between drain-source Vds.

Note that the curve c1 in FIG. 16(b) represents the case that the impurity is implanted in the channel region with the relatively low amount shown in FIG. 15(c). When the amount of the impurity implanted in the channel region increases, it is possible to increase a level of the constant current as a curve d1. Curves e, f, and g represented with hidden lines show changes between the curve c1 and the curve d1. Accordingly, it is possible to obtain a desirable drain current through adjusting the amount of the impurity implanted in the channel region.

As well known in the field of electric device physics, the drain current Id of the MOS transistor is given by the following equation:

$$Id=K\times(W/L)\times(Vgs-Vt)^2$$

where K is a constant, W is a gate width of the MOS transistor, L is a gate length of the MOS transistor, Vgs is the voltage between gate-source, and Vt is the threshold voltage.

As described with reference to FIG. 14, in the anode drive circuit 301 in the second embodiment, the gate terminal of the NMOS depletion type transistor 302 is connected to the source terminal thereof, so that a voltage between gate-source is zero. Accordingly, the drain current Id is given by:

$$Id=K\times(W/L)\times(Vt)^2$$

Accordingly, the drain current Id is determined from a ratio of the gate ratio and the gate length, i.e., an element size, and the threshold voltage Vt.

It is possible to relatively freely adjust the ratio W/L of the element size in a design stage of the element. As described above, it is possible to adjust the threshold voltage Vt through adjusting the amount of the impurity implanted in the channel region, and it is possible to relatively freely adjust the drain current Id. Further, in the MOS transistor, even though the drain potential varies to some extent, it is possible to maintain the drain current constant through setting the gate length thereof at a relatively large value. It is known that the MOS transistor has the constant current property, and it is preferred that the gate length is set at a relatively large value for obtaining a good property.

With reference to FIGS. 15(a) to 15(c) and 16(a)-16(b), the configuration and the property of the NMOS depletion type transistor 302 are explained. When the P-type and the N-type shown in FIG. 15(c) are exchanged, it is possible to form a PMOS depletion type transistor, and to adjust a property thereof similarly to that of the NMOS depletion type transistor 302.

Figure 17:
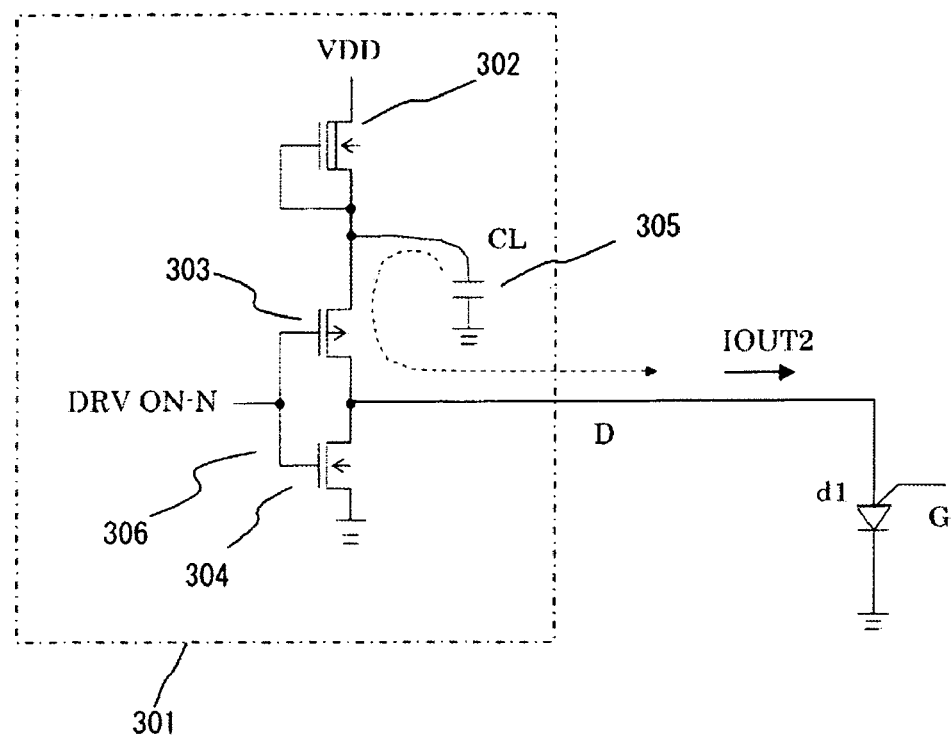
FIG. 17 is a circuit diagram showing an operation of an anode drive circuit according to the second embodiment of the present invention.

FIG. 17 is a circuit diagram showing an operation of the anode drive circuit 301 according to the second embodiment of the present invention. In FIG. 17, one element of the light emitting thyristors d1 to d8 is presented from the circuit diagram shown in FIG. 14. More specifically, the light emitting thyristor d1 and the anode drive circuit 301 are shown in FIG. 17, and the anode current IOUT2 flows in an arrow direction. A capacitor CL 305 schematically represents a floating capacitor inherently generated between the source region of the NMOS depletion type transistor 302 or the source region of the PMOS transistor 303 and ground.

When the light emitting thyristors d1 does not emit light, the drive instruction signal DRV ON-N is at the high level. Further, the PMOS transistor 303 is turned off, and the NMOS transistor 304 is turned on. Further, the NMOS depletion type transistor 302 is always turned on, so that the capacitor CL 305 is charged at a voltage substantially the same as the power source voltage VDD.

Figure 18:
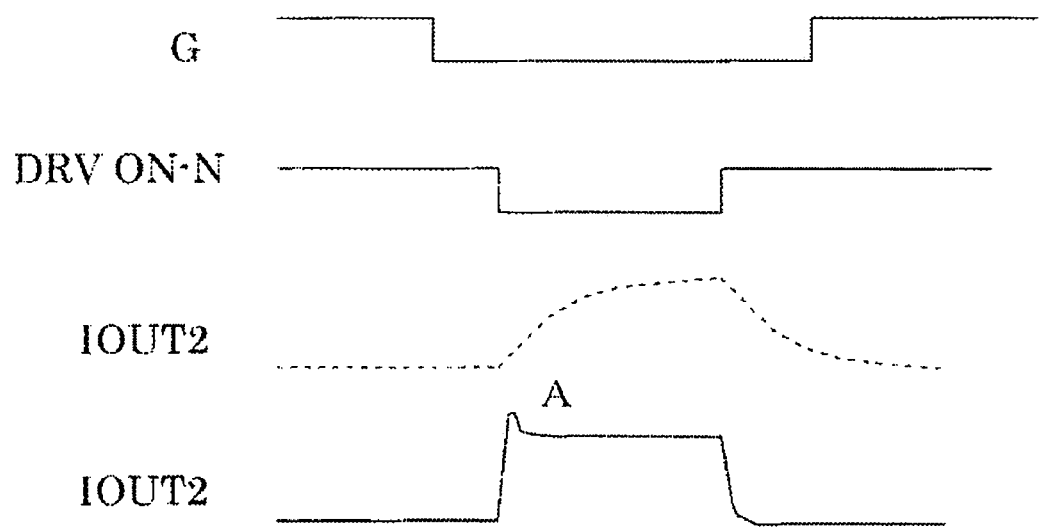
FIG. 18 is a time chart showing the operation of the anode drive circuit according to the second embodiment of the present invention.

FIG. 18 is a time chart showing the operation of the anode drive circuit 301 according to the second embodiment of the present invention. As shown in FIG. 18, the light emitting thyristor d1 has the gate terminal waveform G, and the anode drive circuit 301 (having the configuration shown in FIG. 15) has the anode current IOUT2 represented with a solid line. For comparison, the conventional anode drive circuit (disclosed in Patent Reference) with the resistor as the current regulating element has the anode current IOUT2 represented with a hidden line.

As described above with reference to FIG. 6, when the light emitting thyristor d1 is driven, the gate terminal thereof is set at the low level. Then, the print control unit (not shown) sends the DRV ON-N signal, i.e., the drive on instruction signal, to the anode drive circuit 301 shown in FIG. 17. When the DRV ON-N signal becomes the low level, the PMOS transistor 303 is turned on and the NMOS transistor 304 is turned off. Accordingly, a voltage is applied between the drain terminal and the source terminal of the NMOS depletion type transistor 302. As a result, the charges accumulated in the capacitor CL 305 are rapidly discharged through the PMOS transistor 303 and the light emitting thyristor d1.

As a result, as shown in FIG. 18, the anode current IOUT2 shows a rapid rise or an over shoot as indicated as a portion A. The over shoot waveform is leveled in a relatively short period of time, and becomes the constant level afterward. At this moment, the drain current Id is expressed with the following equation:

$$Id=K\times(W/L)\times(Vt)^2$$

Accordingly, the drain current Id is determined to be a specific value regardless of the power source voltage VDD or the voltage Va between the anode terminal and the cathode terminal of the light emitting thyristor upon emitting light. As a result, the drive current of the light emitting thyristor is not affected, and it is possible to maintain the light emission output of the light emitting thyristor at a specific level.

Afterward, the print control unit (not shown) changes the drive on off instruction signal DRV ON-N from the low level to the high level, and sends the drive on off instruction signal DRV ON-N to the anode drive circuit 301 shown in FIG. 17. Further, the PMOS transistor 303 is turned off, and the NMOS transistor 304 is turned on, so that the anode potential of the light emitting thyristor d1 becomes substantially zero. Accordingly, the light emitting thyristor d1 is turned off and does not emit light. At the same time, the anode current IOUT2 flowing the anode terminal rapidly decreases to a substantially zero level.

At this moment, the capacitor CL 305 is charged again through the NMOS depletion type transistor 302 in an on state. After the capacitor CL 305 is completely charged, the voltage between the drain terminal and the source terminal of the NMOS depletion type transistor 302 becomes substantially zero, and the drain current thereof becomes zero. Note that the PMOS transistor 303 is turned off, so that the current of the NMOS depletion type transistor 302 does not flow to ground through the PMOS transistor 303.

As described above, in the anode drive circuit 301 in the second embodiment, it is possible to maintain the drive current at a specific value regardless of the power source voltage VDD or the voltage Va between the anode terminal and the cathode terminal of the light emitting thyristor upon emitting light. Accordingly, even when the power source voltage VDD varies, it is possible to maintain the light emission output at a constant level, thereby preventing a problem such as a density unevenness in a print output of the printer.

As shown in FIG. 18, as opposed to the anode current IOUT2 of the conventional anode drive circuit represented with the hidden line, the anode current IOUT2 presented with the solid line shows a short rise time and a short fall time. Accordingly, when the anode drive circuit 301 is applied to an LED head necessary for switching on and off repeatedly, it is possible to increase an operation speed thereof.

As described above, in the embodiment, the NMOS depletion type transistor 302 is used in the anode drive circuit 301 as the current regulating circuit of the drive circuit of the light emitting thyristors. Accordingly, when the power source voltage VDD varies, or the voltage Va between the anode terminal and the cathode terminal upon emitting light varies due to a manufacturing variance in the light emitting thyristor, it is possible to minimize the influence on the drive current. Accordingly, the light emission output of the light emitting thyristor is maintained at a constant level. Further, the drive current shows a short rise time and a short fall time, thereby making it possible to increase an operation speed thereof.

Third Embodiment

A third embodiment of the present invention will be explained next. In the third embodiment, the anode drive circuit has a configuration different from those in the first and second embodiments.

Figure 19:
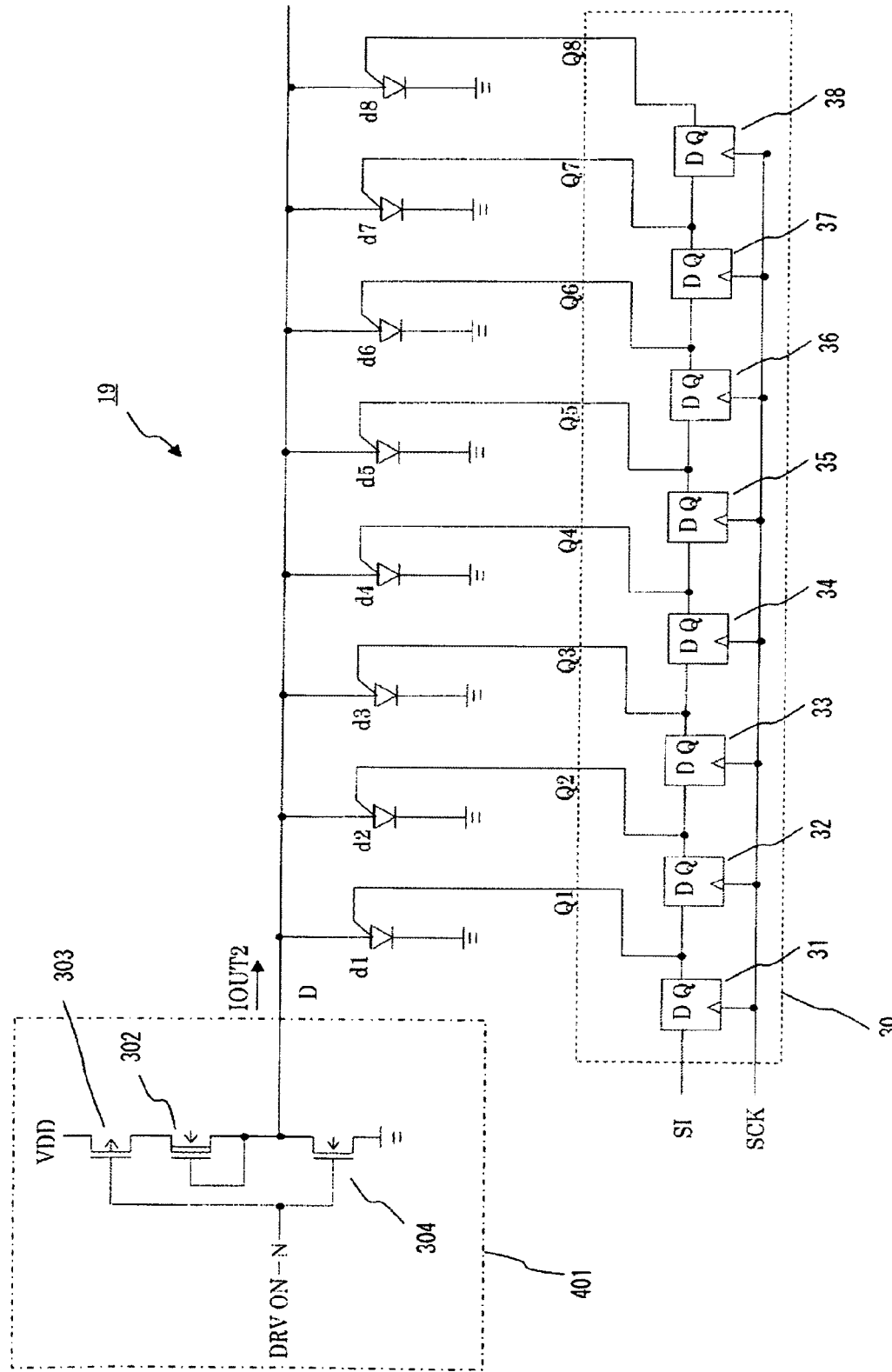
FIG. 19 is a circuit diagram showing a configuration of a light print head according to a third embodiment of the present invention.

FIG. 19 is a circuit diagram showing a configuration of the light print head 19 according to the third embodiment of the present invention. As shown in FIG. 19, the light print head 19 includes eight light emitting elements as a simple representation. In an actual case, when the light print head 19 is capable of printing on an A4 size sheet at a resolution of 600 dots per one inch, the light print head 19 includes 4,992 of the light emitting elements. Accordingly, the configuration shown in FIG. 19 including the light emitting elements and the flip-flop circuits is arranged in 4,992 of stages as a whole.

As shown in FIG. 19, the light print head 19 includes the shift register 30, and the shift register 30 includes the flip-flop circuits 31 to 38. Further, the light print head 19 includes the light emitting thyristors d1 to d8 each having the three terminals, i.e., the anode terminal A, the cathode terminal K, and the gate terminal G.

In the embodiment, the shift register 30 has the serial data input terminal SI and the clock terminal SCK. The serial data terminal SI is connected to the input terminal D of the flip-flop circuit 31, and the output terminal Q of the flip-flop circuit 31 is connected to the input terminal D of the flip-flop circuit 32. Further, the output terminal Q of the flip-flop circuit 31 is connected to the gate terminal of the light emitting thyristor d1. Similarly, the output terminals Q2 to Q8 of the shift register 30 are connected to the gate terminals of the light emitting thyristors d2 to d8, respectively. The clock terminal SCK of the shift register 30 is connected to the clock terminals of the flip-flop circuits 31 to 38. The cathode terminals of the light emitting thyristors d1 to d8 are connected to ground.

In the embodiment, an anode drive circuit 401 is provided for driving the light emitting thyristors d1 to d8. The anode drive circuit 401 has a data terminal D connected to the anode terminals of the light emitting thyristors d1 to d8 for supplying an anode current to drive the light emitting thyristors d1 to d8.

In the embodiment, the anode drive circuit 401 includes the NMOS depletion type transistor 302, the PMOS transistor 303, and the NMOS transistor 304. The source terminal of the PMOS transistor 303 is connected to the power source VDD. The drain terminal of the PMOS transistor 303 is connected to the drain terminal of the NMOS depletion type transistor 302. The source terminal of the NMOS depletion type transistor 302 is connected to the gate terminal thereof, and further connected to the drain terminal of the NMOS transistor 304. The source terminal of the NMOS transistor 304 is connected to ground. The gate terminal of the PMOS transistor 303 is connected to the gate terminal of the NMOS transistor 304.

In the embodiment, the print control unit (not shown) sends the instruction signal DRV ON-N to the gate terminals for instructing on-off of the light emitting thyristors d1 to d8. The source terminal of the NMOS depletion type transistor 302 is connected to the anode terminals, i.e., the data terminal D, of the light emitting thyristors d1 to d8.

As well known in the field of electric device physics, the drain current Id of the MOS transistor is given by the following equation:

$$Id = K \times (W/L) \times (Vgs - Vt)^2$$

where K is a constant, W is a gate width of the MOS transistor, L is a gate length of the MOS transistor, Vgs is the voltage between gate-source, and Vt is the threshold voltage.

As described with reference to FIG. 19, in the anode drive circuit 401 in the third embodiment, the gate terminal of the NMOS depletion type transistor 302 is connected to the source terminal thereof, so that a voltage between gate-source is zero. Accordingly, the drain current Id is given by:

$$Id = K \times (W/L) \times (Vt)^2$$

Accordingly, the drain current Id is determined from a ratio of the gate ratio and the gate length, i.e., an element size, and the threshold voltage Vt.

It is possible to relatively freely adjust the ratio W/L of the element size in a design stage of the element. As described above, it is possible to adjust the threshold voltage Vt through adjusting the amount of the impurity implanted in the channel region, and it is possible to relatively freely adjust the drain current Id. Further, in the MOS transistor, even though the drain potential varies to some extent, it is possible to maintain the drain current constant through setting the gate length thereof at a relatively large value. It is known that the MOS transistor has the constant current property, and it is preferred that the gate length is set at a relatively large value for obtaining a good property.

Figure 20:
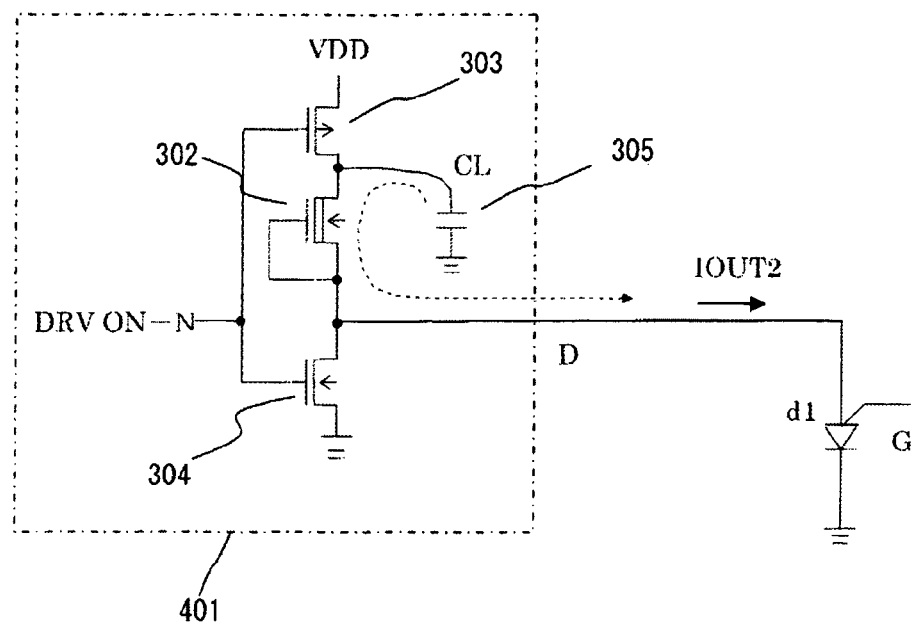
FIG. 20 is a circuit diagram showing an operation of an anode drive circuit according to the third embodiment of the present invention.

An operation of the anode drive circuit 401 will be explained next. FIG. 20 is a circuit diagram showing the operation of the anode drive circuit 401 according to the third embodiment of the present invention. In FIG. 20, one element of the light emitting thyristors d1 to d8 is presented from the circuit diagram shown in FIG. 19. More specifically, the light emitting thyristor d1 and the anode drive circuit 401 are shown in FIG. 20, and the anode current IOUT2 flows in an arrow direction. The capacitor CL 305 schematically represents a floating capacitor inherently generated between the drain region of the NMOS depletion type transistor 302 or the drain region of the PMOS transistor 303 and ground.

When the light emitting thyristors d1 does not emit light, the drive instruction signal DRV ON-N is at the high level. Further, the PMOS transistor 303 is turned off, and the NMOS transistor 304 is turned on. Further, the NMOS depletion type transistor 302 is always turned on, so that a voltage of substantially zero is applied to both ends of the capacitor CL 305 and substantially no charges are accumulated.

Figure 21:
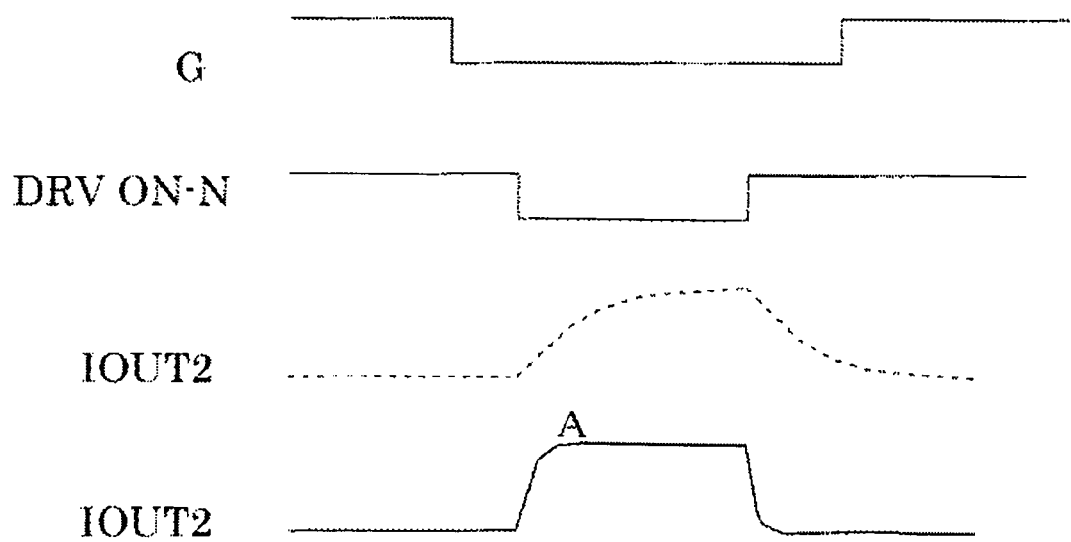
FIG. 21 is a time chart showing the operation of the anode drive circuit according to the third embodiment of the present invention.

FIG. 21 is a time chart showing the operation of the anode drive circuit 401 according to the third embodiment of the present invention. As shown in FIG. 21, the light emitting thyristor d1 has the gate terminal waveform G, and the anode drive circuit 401 has the anode current IOUT2 represented with a solid line. For comparison, the conventional anode drive circuit with the resistor as the current regulating element has the anode current IOUT2 represented with a hidden line.

As described above with reference to FIG. 6 in the first embodiment, in the time chart shown in FIG. 21, when the light emitting thyristor d1 is driven, the gate terminal thereof changes from the high level to the low level. Then, the print control unit (not shown) sends the DRV ON-N signal, i.e., the drive on instruction signal, to the anode drive circuit 401 shown in FIG. 21. When the DRV ON-N signal becomes the low level, the PMOS transistor 303 is turned on and the NMOS transistor 304 is turned off. Accordingly, a voltage is applied between the drain terminal and the source terminal of the NMOS depletion type transistor 302.

As a result, the charges are rapidly accumulated in the capacitor CL 305 through the PMOS transistor 303. At the same time, a current flows in the drain terminal of the NMOS depletion type transistor 302. As a result, as shown in FIG. 21, the anode current IOUT2 shows a rapid rise or an over shoot as indicated as a portion A. The over shoot waveform is leveled in a relatively short period of time, and becomes the constant level afterward. At this moment, the drain current Id is expressed with the following equation:

$$Id = K \times (W/L) \times (Vt)^2$$

Accordingly, the drain current Id is determined to be a specific value regardless of the power source voltage VDD or the voltage Va between the anode terminal and the cathode terminal of the light emitting thyristor upon emitting light. As a result, the drive current of the light emitting thyristor is not affected, and it is possible to maintain the light emission output of the light emitting thyristor at a specific level.

Afterward, the print control unit (not shown) changes the drive on off instruction signal DRV ON-N from the low level to the high level, and sends the drive on off instruction signal DRV ON-N to the anode drive circuit 401 shown in FIG. 20. When the drive on off instruction signal DRV ON-N becomes the high level, the PMOS transistor 303 is turned off, and the NMOS transistor 304 is turned on, so that the anode potential of the light emitting thyristor d1 becomes substantially zero. Accordingly, the light emitting thyristor d1 is turned off and does not emit light. At the same time, the anode current IOUT2 flowing the anode terminal rapidly decreases to a substantially zero level.

At this moment, the capacitor CL 305 is discharged through the NMOS depletion type transistor 302 in the on state, so that the potential thereof becomes substantially zero. Note that the PMOS transistor 303 is turned off, so that the drain current of the NMOS depletion type transistor 302 is shut off and does not flow to ground.

As described above, in the anode drive circuit 401 in the third embodiment, it is possible to maintain the drive current at a specific value regardless of the power source voltage VDD or the voltage Va between the anode terminal and the cathode terminal of the light emitting thyristor upon emitting light. Accordingly, even when the power source voltage VDD varies, it is possible to maintain the light emission output at a constant level, thereby preventing a problem such as a density unevenness in a print output of the printer.

As shown in FIG. 21, as opposed to the anode current IOUT2 of the conventional anode drive circuit represented with the hidden line, the anode current IOUT2 presented with the solid line shows a short rise time and a short fall time. Accordingly, when the anode drive circuit 401 is applied to an LED head necessary for switching on and off repeatedly, it is possible to increase an operation speed thereof.

As described above, in the embodiment, the NMOS depletion type transistor 302 is used in the anode drive circuit 401 as the current regulating circuit of the drive circuit of the light emitting thyristors. Accordingly, when the power source voltage VDD varies, or the voltage Va between the anode terminal and the cathode terminal upon emitting light varies due to a manufacturing variance in the light emitting thyristor, it is possible to minimize the influence on the drive current. Accordingly, the light emission output of the light emitting thyristor is maintained at a constant level. Further, the drive current shows a short rise time and a short fall time, thereby making it possible to increase an operation speed thereof.

Fourth Embodiment

A fourth embodiment of the present invention will be explained next. In the fourth embodiment, the anode drive circuit has a configuration different from those in the first to third embodiments.

Figure 22:
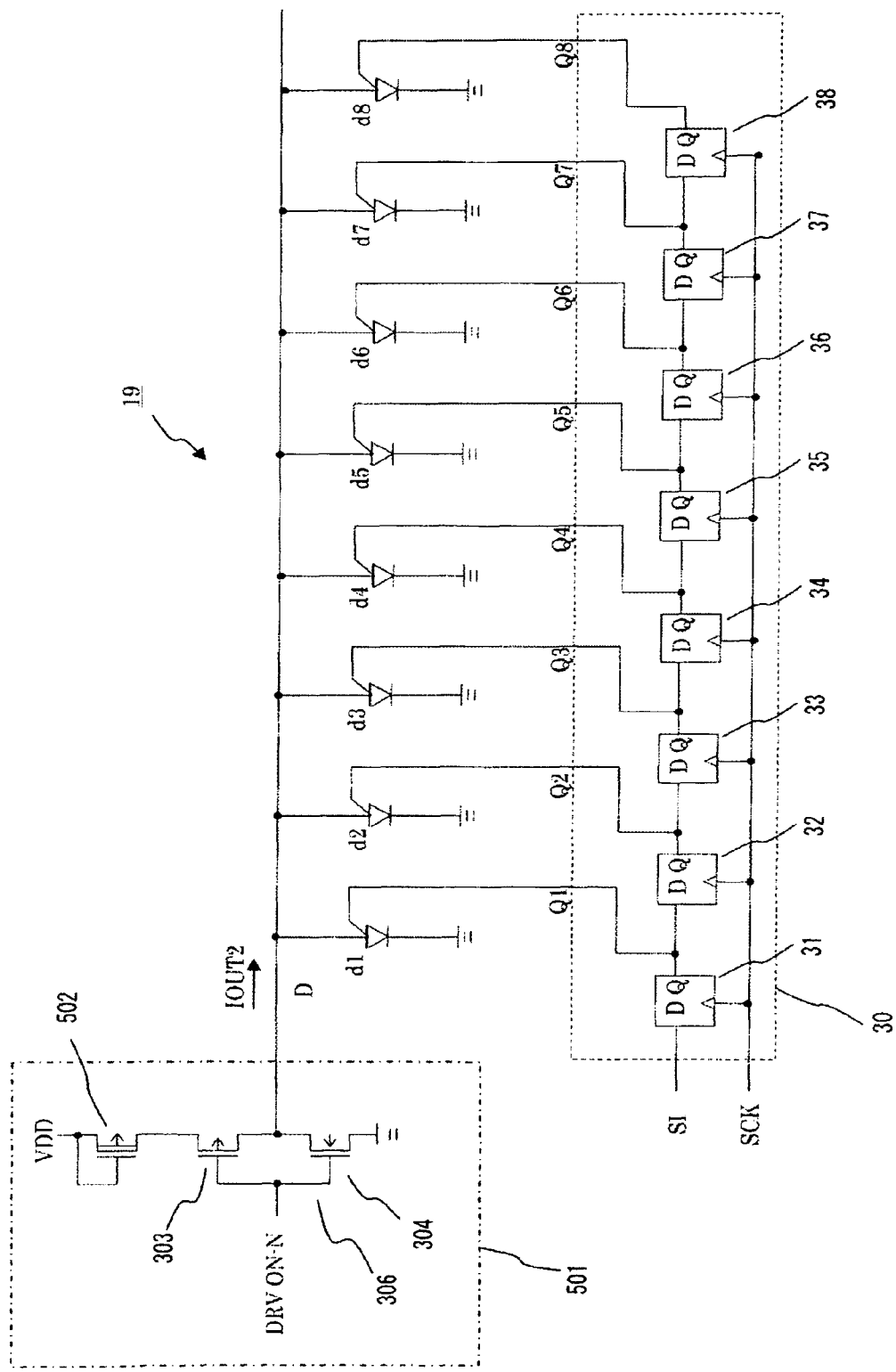
FIG. 22 is a circuit diagram showing a configuration of a light print head according to a fourth embodiment of the present invention.

FIG. 22 is a circuit diagram showing a configuration of the light print head 19 according to the fourth embodiment of the present invention. As shown in FIG. 22, the light print head 19 includes eight light emitting elements as a simple representation. In an actual case, when the light print head 19 is capable of printing on an A4 size sheet at a resolution of 600 dots per one inch, the light print head 19 includes 4,992 of the light emitting elements. Accordingly, the configuration shown in FIG. 22 including the light emitting elements and the flip-flop circuits is arranged in 4,992 of stages as a whole.

As shown in FIG. 22, the light print head 19 includes the shift register 30, and the shift register 30 includes the flip-flop circuits 31 to 38. Further, the light print head 19 includes the light emitting thyristors d1 to d8 each having the three terminals, i.e., the anode terminal A, the cathode terminal K, and the gate terminal G.

In the embodiment, the shift register 30 has the serial data input terminal SI and the clock terminal SCK. The serial data terminal SI is connected to the input terminal D of the flip-flop circuit 31, and the output terminal Q of the flip-flop circuit 31 is connected to the input terminal D of the flip-flop circuit 32.

Further, the output terminal Q of the flip-flop circuit 31 is connected to the gate terminal of the light emitting thyristor d1. Similarly, the output terminals Q2 to Q8 of the shift register 30 are connected to the gate terminals of the light emitting thyristors d2 to d8, respectively. The clock terminal SCK of the shift register 30 is connected to the clock terminals of the flip-flop circuits 31 to 38. The cathode terminals of the light emitting thyristors d1 to d8 are connected to ground.

In the embodiment, an anode drive circuit 501 is provided for driving the light emitting thyristors d1 to d8. The anode drive circuit 501 has a data terminal D connected to the anode terminals of the light emitting thyristors d1 to d8 for supplying an anode current to drive the light emitting thyristors d1 to d8.

In the embodiment, the anode drive circuit 501 includes the PMOS transistor 303 and the NMOS transistor 304. The drain terminal of the PMOS transistor 303 is connected to the drain terminal of the NMOS transistor 304. The source terminal of the NMOS transistor 304 is connected to ground. The gate terminal of the PMOS transistor 303 is connected to the gate terminal of the NMOS transistor 304. The PMOS transistor 303 and the NMOS transistor 304 constitute the inverter circuit 306.

In the embodiment, the inverter circuit 306 receives the instruction signal DRV ON-N from the print control unit (not shown) for instructing on-off of the light emitting thyristors d1 to d8. The output terminal of the inverter circuit 306 (the drain terminal of the PMOS transistor 303) is connected to the anode terminals or the data terminals D of the light emitting thyristors d1 to d8. A PMOS depletion type transistor 502 has a gate terminal and a source terminal connected to the power source VDD, and a drain terminal connected to the source terminal of the PMOS transistor 303.

Figure 23:
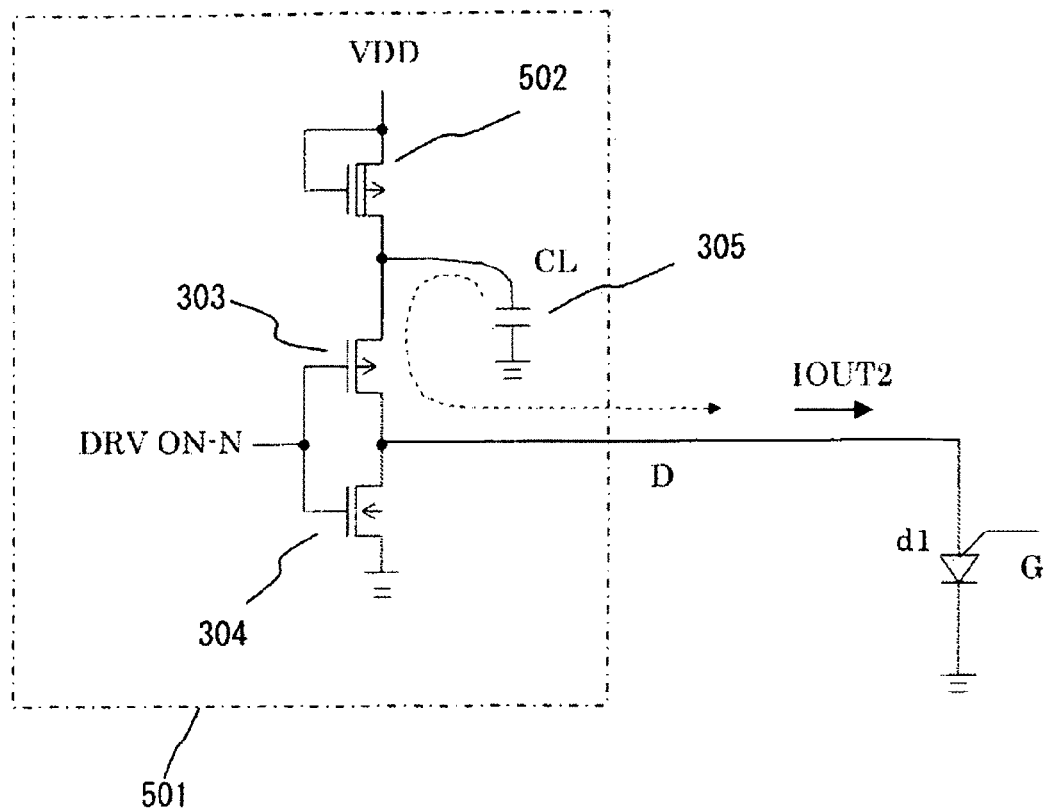
FIG. 23 is a circuit diagram showing an operation of an anode drive circuit according to the fourth embodiment of the present invention.

An operation of the anode drive circuit 501 will be explained next. FIG. 23 is a circuit diagram showing the operation of the anode drive circuit 501 according to the third embodiment of the present invention. In FIG. 23, one element of the light emitting thyristors d1 to d8 is presented from the circuit diagram shown in FIG. 22. More specifically, the light emitting thyristor d1 and the anode drive circuit 501 are shown in FIG. 23, and the anode current IOUT2 flows in an arrow direction. The capacitor CL 305 schematically represents a floating capacitor inherently generated between a drain region of the PMOS depletion type transistor 502 or the drain region of the PMOS transistor 303 and ground.

When the light emitting thyristors d1 does not emit light, the drive instruction signal DRV ON-N is at the high level. Further, the PMOS transistor 303 is turned off, and the NMOS transistor 304 is turned on. Further, the PMOS depletion type transistor 502 is always turned on, so that a voltage substantially the same as the power source voltage VDD is applied to the both ends of the capacitor CL 305 to accumulate charges.

Figure 24:
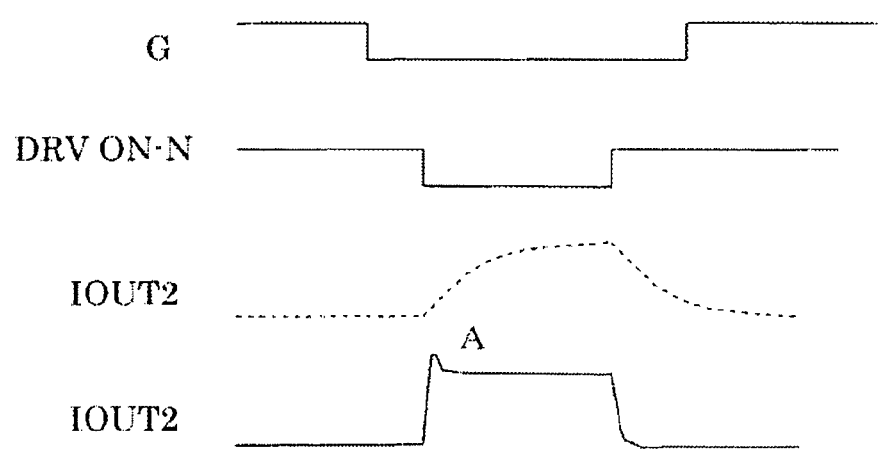
FIG. 24 is a time chart showing the operation of the anode drive circuit according to the fourth embodiment of the present invention.

FIG. 24 is a time chart showing the operation of the anode drive circuit 501 according to the fourth embodiment of the present invention. As shown in FIG. 24, the light emitting thyristor d1 has the gate terminal waveform G, and the anode drive circuit 501 has the anode current IOUT2 represented with a solid line. For comparison, the conventional anode drive circuit with the resistor as the current regulating element has the anode current IOUT2 represented with a hidden line.

As described above with reference to FIG. 6 in the first embodiment, in the time chart shown in FIG. 24, when the light emitting thyristor d1 is driven, the gate terminal thereof changes from the high level to the low level. Then, the print control unit (not shown) sends the DRV ON-N signal, i.e., the drive on instruction signal, to the anode drive circuit 501 shown in FIG. 23. When the DRV ON-N signal becomes the low level, the PMOS transistor 303 is turned on and the NMOS transistor 304 is turned off. Accordingly, a voltage is applied between the drain terminal and the source terminal of the PMOS depletion type transistor 502.

As a result, the charges accumulated in the capacitor CL 305 are rapidly discharged through the PMOS transistor 303 and the light emitting thyristor d1. As a result, as shown in FIG. 24, the anode current IOUT2 shows a rapid rise or an over shoot as indicated as a portion A. The over shoot waveform is leveled in a relatively short period of time, and becomes the constant level afterward. At this moment, the drain current Id is expressed with the following equation:

$$Id = K \times (W/L) \times (Vt)^2$$

Accordingly, the drain current Id is determined to be a specific value regardless of the power source voltage VDD or the voltage Va between the anode terminal and the cathode terminal of the light emitting thyristor upon emitting light. As a result, the drive current of the light emitting thyristor is not affected, and it is possible to maintain the light emission output of the light emitting thyristor at a specific level.

Afterward, the print control unit (not shown) changes the drive on off instruction signal DRV ON-N from the low level to the high level, and sends the drive on off instruction signal DRV ON-N to the anode drive circuit 501 shown in FIG. 23. When the drive on off instruction signal DRV ON-N becomes the high level, the PMOS transistor 303 is turned off, and the NMOS transistor 304 is turned on, so that the anode potential of the light emitting thyristor d1 becomes substantially zero. Accordingly, the light emitting thyristor d1 is turned off and does not emit light. At the same time, the anode current IOUT2 flowing the anode terminal rapidly decreases to a substantially zero level.

At this moment, the capacitor CL 305 is charged again through the PMOS depletion type transistor 502 in the on state, so that the potential thereof becomes substantially zero. After the capacitor CL 305 is completely charged, the voltage between the drain terminal and the source terminal of the PMOS depletion type transistor 502 becomes substantially zero, and the drain current thereof becomes substantially zero. Note that the PMOS transistor 303 is turned off, so that the drain current of the PMOS depletion type transistor 502 does not flow to ground.

As described above, in the anode drive circuit 501 in the fourth embodiment, it is possible to maintain the drive current at a specific value regardless of the power source voltage VDD or the voltage Va between the anode terminal and the cathode terminal of the light emitting thyristor upon emitting light. Accordingly, even when the power source voltage VDD varies, it is possible to maintain the light emission output at a constant level, thereby preventing a problem such as a density unevenness in a print output of the printer.

As shown in FIG. 24, as opposed to the anode current IOUT2 of the conventional anode drive circuit represented with the hidden line, the anode current IOUT2 presented with the solid line shows a short rise time and a short fall time. Accordingly, when the anode drive circuit 501 is applied to an LED head necessary for switching on and off repeatedly, it is possible to increase an operation speed thereof.

As described above, in the embodiment, the PMOS depletion type transistor 502 is used in the anode drive circuit 501 as the current regulating circuit of the drive circuit of the light emitting thyristors. Accordingly, when the power source voltage VDD varies, or the voltage Va between the anode terminal and the cathode terminal upon emitting light varies due to a manufacturing variance in the light emitting thyristor, it is possible to minimize the influence on the drive current.

Accordingly, the light emission output of the light emitting thyristor is maintained at a constant level. Further, the drive current shows a short rise time and a short fall time, thereby making it possible to increase an operation speed thereof.

Fifth Embodiment

A fifth embodiment of the present invention will be explained next. In the fifth embodiment, the anode drive circuit has a configuration different from those in the first to fourth embodiments.

Figure 25:
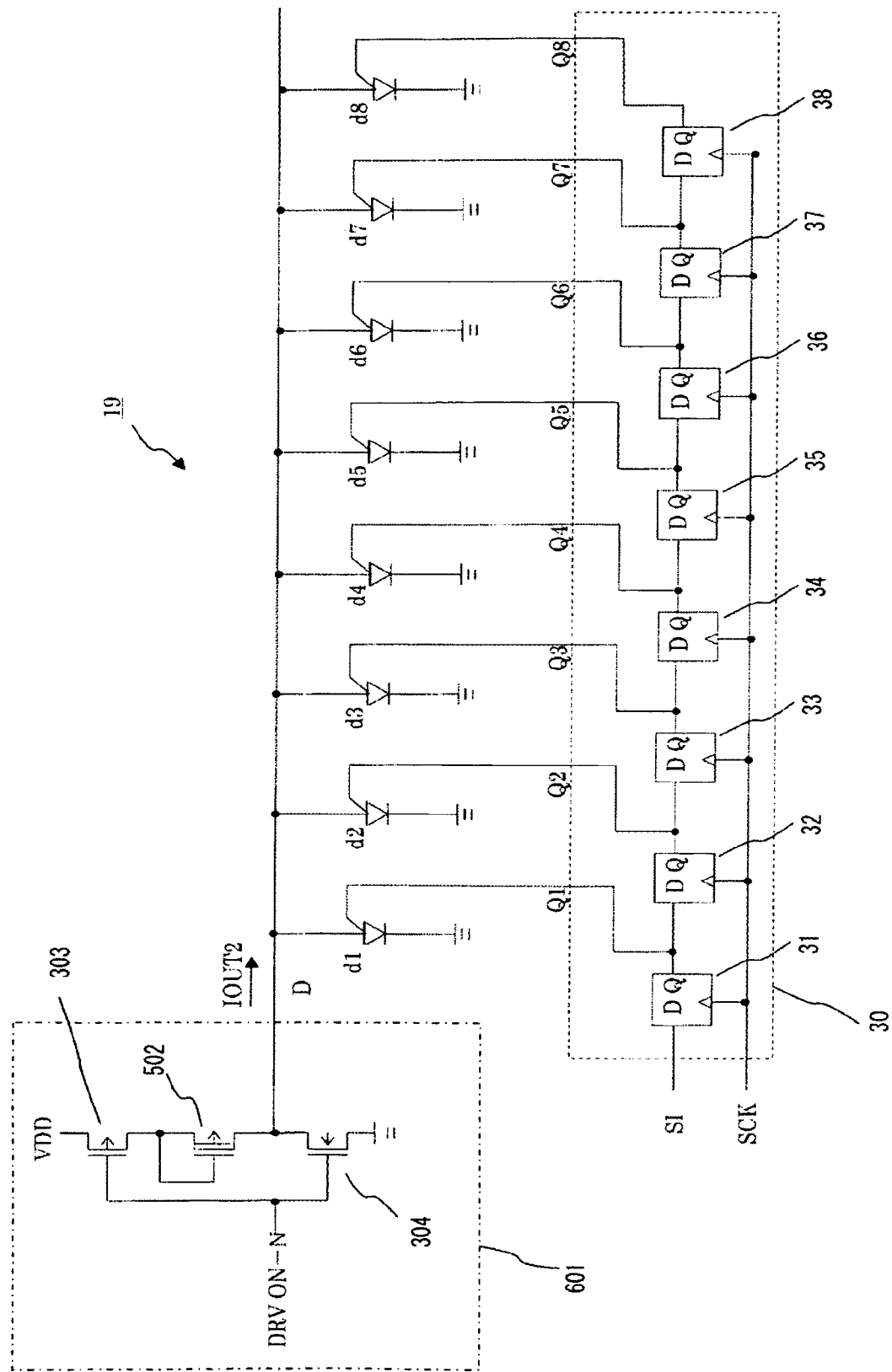
FIG. 25 is a circuit diagram showing a configuration of a light print head according to a fifth embodiment of the present invention.

FIG. 25 is a circuit diagram showing a configuration of the light print head 19 according to the fifth embodiment of the present invention. As shown in FIG. 25, the light print head 19 includes eight light emitting elements as a simple representation. In an actual case, when the light print head 19 is capable of printing on an A4 size sheet at a resolution of 600 dots per one inch, the light print head 19 includes 4,992 of the light emitting elements. Accordingly, the configuration shown in FIG. 22 including the light emitting elements and the flip-flop circuits is arranged in 4,992 of stages as a whole.

As shown in FIG. 25, the light print head 19 includes the shift register 30, and the shift register 30 includes the flip-flop circuits 31 to 38. Further, the light print head 19 includes the light emitting thyristors d1 to d8 each having the three terminals, i.e., the anode terminal A, the cathode terminal K, and the gate terminal G.

In the embodiment, the shift register 30 has the serial data input terminal SI and the clock terminal SCK. The serial data terminal SI is connected to the input terminal D of the flip-flop circuit 31, and the output terminal Q of the flip-flop circuit 31 is connected to the input terminal D of the flip-flop circuit 32. Further, the output terminal Q of the flip-flop circuit 31 is connected to the gate terminal of the light emitting thyristor d1. Similarly, the output terminals Q2 to Q8 of the shift register 30 are connected to the gate terminals of the light emitting thyristors d2 to d8, respectively. The clock terminal SCK of the shift register 30 is connected to the clock terminals of the flip-flop circuits 31 to 38. The cathode terminals of the light emitting thyristors d1 to d8 are connected to ground.

In the embodiment, an anode drive circuit 601 is provided for driving the light emitting thyristors d1 to d8. The anode drive circuit 601 has a data terminal D connected to the anode terminals of the light emitting thyristors d1 to d8 for supplying an anode current to drive the light emitting thyristors d1 to d8.

In the embodiment, the anode drive circuit 601 includes the PMOS depletion type transistor 502, the PMOS transistor 303, and the NMOS transistor 304. The source terminal of the PMOS transistor 303 is connected to the power source VDD. The drain terminal of the PMOS transistor 303 is connected to the source terminal and the gate terminal of the PMOS depletion type transistor 502. The drain terminal of the PMOS depletion type transistor 502 is connected to the drain terminal of the NMOS transistor 304.

In the embodiment, the source terminal of the NMOS transistor 304 is connected to ground. The gate terminal of the PMOS transistor 303 is connected to the gate terminal of the NMOS transistor 304. The gate terminals of the PMOS transistor 303 and the NMOS transistor 304 receive the instruction signal DRV ON-N from the print control unit (not shown) for instructing on-off of the light emitting thyristors d1 to d8. The source terminal of the NMOS transistor 304 is connected to the anode terminals or the data terminals D of the light emitting thyristors d1 to d8.

As well known in the field of electric device physics, the drain current Id of the MOS transistor is given by the following equation:

$$Id = K \times (W/L) \times (Vgs - Vt)^2$$

where K is a constant, W is a gate width of the MOS transistor, L is a gate length of the MOS transistor, Vgs is the voltage between gate-source, and Vt is the threshold voltage.

As described with reference to FIG. 25, in the anode drive circuit 601 in the fifth embodiment, the gate terminal of the PMOS depletion type transistor 502 is connected to the source terminal thereof, so that a voltage between gate-source is zero. Accordingly, the drain current Id is given by:

$$Id = K \times (W/L) \times (Vt)^2$$

Accordingly, the drain current Id is determined from a ratio of the gate ratio and the gate length, i.e., an element size, and the threshold voltage Vt.

It is possible to relatively freely adjust the ratio W/L of the element size in a design stage of the element. As described above, it is possible to adjust the threshold voltage Vt through adjusting the amount of the impurity implanted in the channel region, and it is possible to relatively freely adjust the drain current Id. Further, in the MOS transistor, even though the drain potential varies to some extent, it is possible to maintain the drain current constant through setting the gate length thereof at a relatively large value. It is known that the MOS transistor has the constant current property, and it is preferred that the gate length is set at a relatively large value for obtaining a good property.

Figure 26:
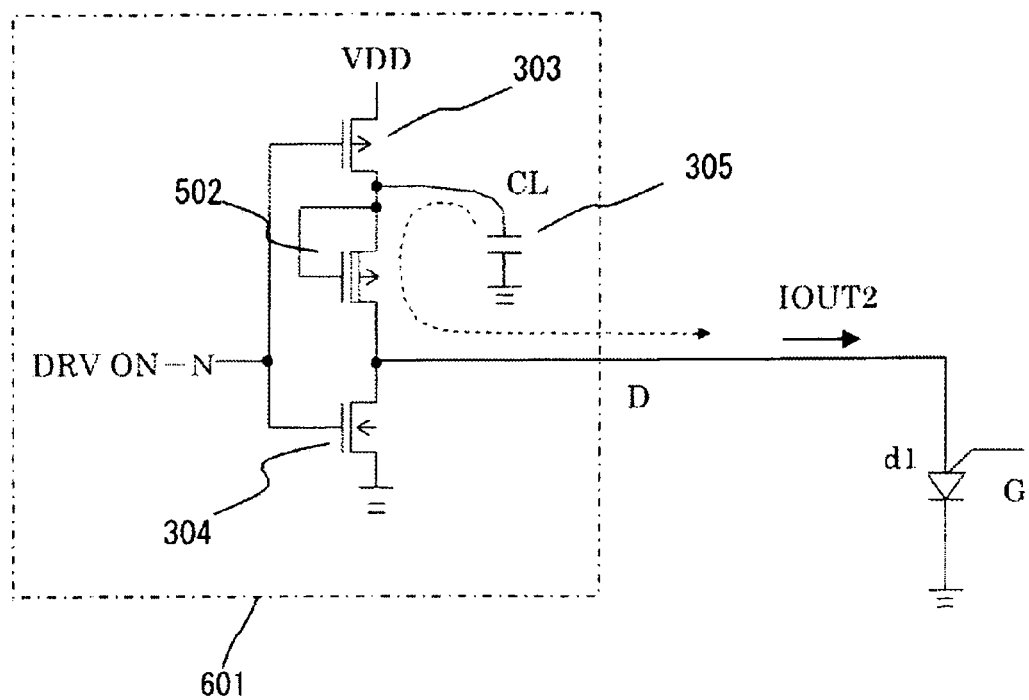
FIG. 26 is a circuit diagram showing an operation of an anode drive circuit according to the fifth embodiment of the present invention.

An operation of the anode drive circuit 601 will be explained next. FIG. 26 is a circuit diagram showing the operation of the anode drive circuit 601 according to the fifth embodiment of the present invention. In FIG. 26, one element of the light emitting thyristors d1 to d8 is presented from the circuit diagram shown in FIG. 25. More specifically, the light emitting thyristor d1 and the anode drive circuit 601 are shown in FIG. 26, and the anode current IOUT2 flows in an arrow direction. The capacitor CL 305 schematically represents a floating capacitor inherently generated between the drain region of the PMOS transistor 303 or a source region of the PMOS depletion type transistor 502 and ground.

When the light emitting thyristors d1 does not emit light, the drive instruction signal DRV ON-N is at the high level. Further, the PMOS transistor 303 is turned off, and the NMOS transistor 304 is turned on. Further, the PMOS depletion type transistor 502 is always turned on, so that a voltage of substantially zero is applied to the both ends of the capacitor CL 30, thereby accumulating no charges.

Figure 27:
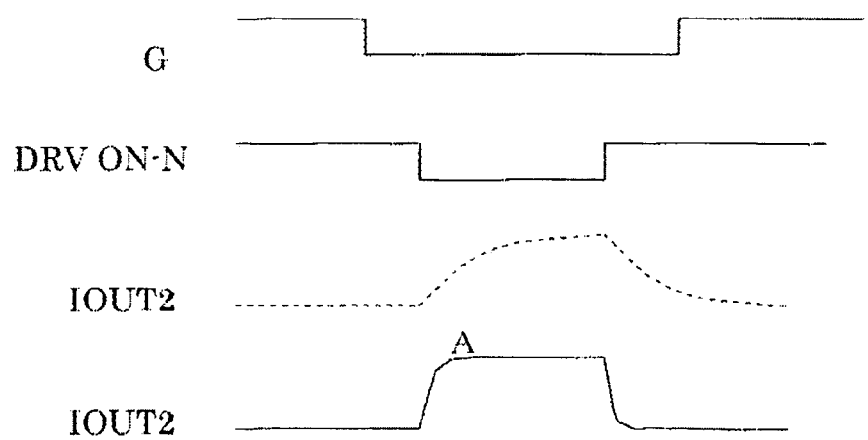
FIG. 27 is a time chart showing the operation of the anode drive circuit according to the fifth embodiment of the present invention.
Figure 28A:
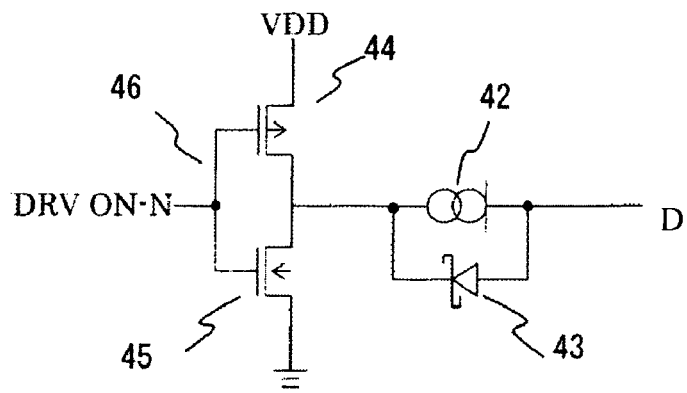
Figure 28B:
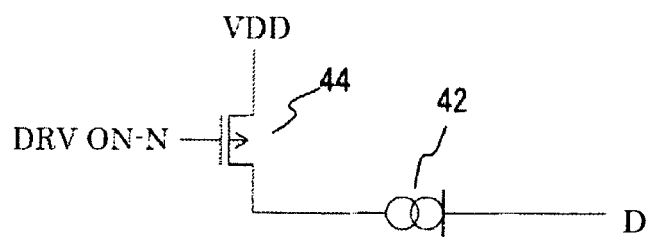
Figure 28C:
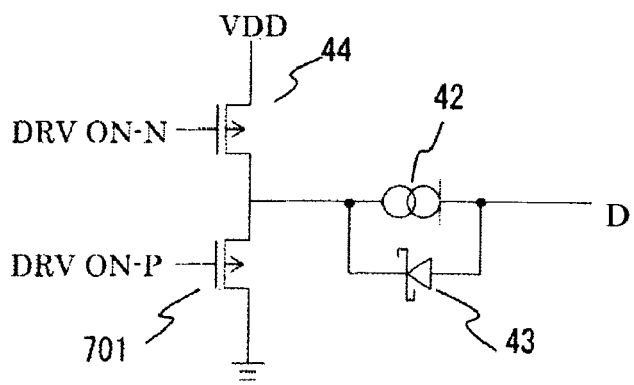
Figure 28D:
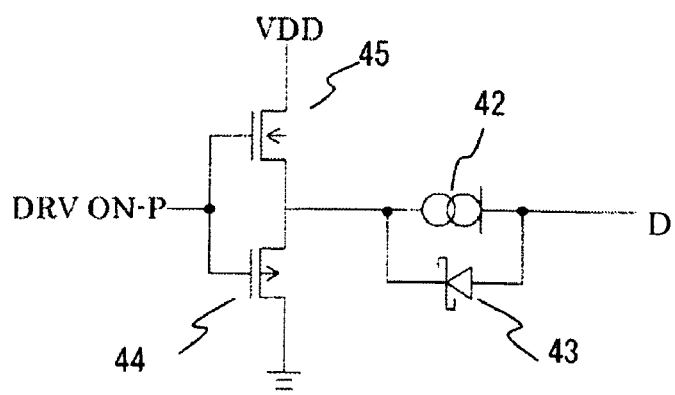

FIG. 27 is a time chart showing the operation of the anode drive circuit 601 according to the fifth embodiment of the present invention. As shown in FIG. 27, the light emitting thyristor d1 has the gate terminal waveform G, and the anode drive circuit 601 has the anode current IOUT2 represented with a solid line. For comparison, the conventional anode drive circuit with the resistor as the current regulating element has the anode current IOUT2 represented with a hidden line.

As described above with reference to FIG. 6 in the first embodiment, in the time chart shown in FIG. 27, when the light emitting thyristor d1 is driven, the gate terminal thereof changes from the high level to the low level. Then, the print control unit (not shown) sends the DRV ON-N signal, i.e., the drive on instruction signal, to the anode drive circuit 601 shown in FIG. 26. When the DRV ON-N signal becomes the low level, the PMOS transistor 303 is turned on and the NMOS transistor 304 is turned off. Accordingly, a voltage is applied between the drain terminal and the source terminal of the PMOS depletion type transistor 502.

As a result, the charges are rapidly accumulated in the capacitor CL 305 through the PMOS transistor 303. At the same time, the drain current flows in the PMOS depletion type transistor 502. As a result, as shown in FIG. 27, the anode current IOUT2 shows a rapid rise or an over shoot as indicated as a portion A. The over shoot waveform is leveled in a relatively short period of time, and becomes the constant level afterward. At this moment, the drain current Id is expressed with the following equation:

$$Id = K \times (W/L) \times (Vt)^2$$

Accordingly, the drain current Id is determined to be a specific value regardless of the power source voltage VDD or the voltage Va between the anode terminal and the cathode terminal of the light emitting thyristor upon emitting light. As a result, the drive current of the light emitting thyristor is not affected, and it is possible to maintain the light emission output of the light emitting thyristor at a specific level.

Afterward, the print control unit (not shown) changes the drive on off instruction signal DRV ON-N from the low level to the high level, and sends the drive on off instruction signal DRV ON-N to the anode drive circuit 601 shown in FIG. 26. When the drive on off instruction signal DRV ON-N becomes the high level, the PMOS transistor 303 is turned off, and the NMOS transistor 304 is turned on, so that the anode potential of the light emitting thyristor d1 becomes substantially zero. Accordingly, the light emitting thyristor d1 is turned off and does not emit light.

At this moment, the capacitor CL 305 is discharged through the PMOS depletion type transistor 502 in the on state, so that the potential thereof becomes substantially zero. Note that the PMOS transistor 303 is turned off, so that the drain current of the PMOS depletion type transistor 502 does not flow to ground.

As described above, in the anode drive circuit 601 in the fifth embodiment, it is possible to maintain the drive current at a specific value regardless of the power source voltage VDD or the voltage Va between the anode terminal and the cathode terminal of the light emitting thyristor upon emitting light. Accordingly, even when the power source voltage VDD varies, it is possible to maintain the light emission output at a constant level, thereby preventing a problem such as a density unevenness in a print output of the printer.

As shown in FIG. 27, as opposed to the anode current IOUT2 of the conventional anode drive circuit represented with the hidden line, the anode current IOUT2 presented with the solid line shows a short rise time and a short fall time. Accordingly, when the anode drive circuit 601 is applied to an LED head necessary for switching on and off repeatedly, it is possible to increase an operation speed thereof.

As described above, in the embodiment, the PMOS depletion type transistor 502 is used in the anode drive circuit 601 as the current regulating circuit of the drive circuit of the light emitting thyristors. Accordingly, when the power source voltage VDD varies, or the voltage Va between the anode terminal and the cathode terminal upon emitting light varies due to a manufacturing variance in the light emitting thyristor, it is possible to minimize the influence on the drive current. Accordingly, the light emission output of the light emitting thyristor is maintained at a constant level. Further, the drive current shows a short rise time and a short fall time, thereby making it possible to increase an operation speed thereof.

Modified Configurations of First Embodiment

Modified configurations of the first embodiment will be explained next. FIGS. 28(*a*) to 28(*d*) are circuit diagrams showing the modified configurations of the anode drive circuit 40 according to the first embodiment of the present invention. More specifically, FIG. 28(*a*) is the circuit diagram of the configuration of the anode drive circuit 40 according to the first embodiment of the present invention, FIG. 28(*b*) is a circuit diagram of a first modified configuration of the anode drive circuit 40, FIG. 28(*c*) is a circuit diagram of a second modified configuration of the anode drive circuit 40, and FIG. 28(*d*) is a circuit diagram of a third modified configuration of the anode drive circuit 40.

As explained in the first embodiment, as shown in FIG. 28(*a*), the anode drive circuit 40 includes the inverter circuit formed of the PMOS transistor 44 and the NMOS transistor 45, the constant current diode 42, and the diode 43. Further, the anode drive circuit 40 receives the DRV ON-N signal of a negative logic for instructing on-off of the drive. The data terminal D of the anode drive circuit 40 is connected to the anode terminals of the light emitting thyristors for driving the same. Further, the anode drive circuit 40 is connected to the power source VDD.

As shown in FIG. 28(*b*), the anode drive circuit having the first modified configuration of the first embodiment includes the PMOS transistor 44 connected to the DRV ON-N signal of the negative logic for instructing on of the drive, and the constant current diode 42. The source terminal of the PMOS transistor 44 is connected to the power source VDD, and the drain terminal thereof is connected to the constant current diode 42.

As shown in FIG. 28(*c*), the anode drive circuit having the second modified configuration of the first embodiment includes the PMOS transistor 44, a PMOS transistor 701, the constant current diode 42, and the diode 43. The source terminal of the PMOS transistor 44 is connected to the power source VDD, and the gate terminal thereof is connected to the DRV ON-N signal of the negative logic for instructing on of the drive. The drain terminal of the PMOS transistor 44 is connected to the PMOS transistor 701. A gate terminal of the PMOS transistor 701 is connected to the DRV ON-P signal of a positive logic for instructing on of the drive. Note that the constant current diode 42 and the diode 43 have configurations the same as those in the first embodiment.

As shown in FIG. 28(*d*), the anode drive circuit having the second modified configuration of the first embodiment includes the NMOS transistor 45, the PMOS transistor 44, the constant current diode 42, and the diode 43. The NMOS transistor 45 is connected to the power source VDD. The gate terminals of the NMOS transistor 45 and the PMOS transistor 44 are connected to the DRV ON-P signal of the positive logic for instructing on of the drive. Note that the constant current diode 42 and the diode 43 have configurations the same as those in the first embodiment.

Modified Configurations of Second Embodiment

Modified configurations of the second embodiment will be explained next. FIGS. 29(*a*) to 29(*d*) are circuit diagrams showing the modified configurations of the anode drive circuit 301 according to the second embodiment of the present invention. More specifically, FIG. 29(*a*) is the circuit diagram of the configuration of the anode drive circuit 301 according to the second embodiment of the present invention, FIG. 29(*b*) is a circuit diagram of a first modified configuration of the anode drive circuit 301, FIG. 29(*c*) is a circuit diagram of a second modified configuration of the anode drive circuit 301, and FIG. 29(*d*) is a circuit diagram of a third modified configuration of the anode drive circuit 301.

Figure 29A:
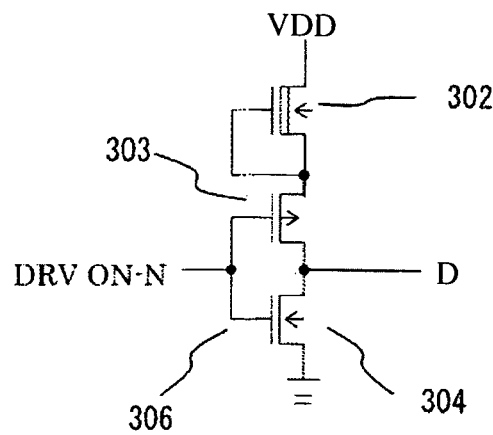

As explained in the second embodiment, as shown in FIG. 29(a), the anode drive circuit 301 includes the PMOS transistor 303, the NMOS transistor 304, and the NMOS depletion type transistor 302. Further, the PMOS transistor 303 and the NMOS transistor 304 constitute the inverter circuit 306, and are connected to the DRV ON-N signal of the negative logic for instructing on of the drive.

Figure 29B:
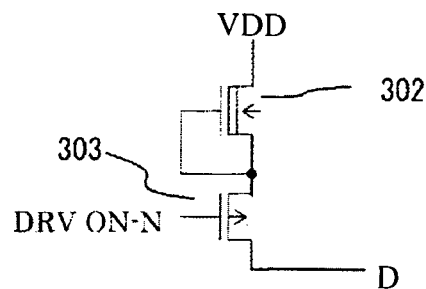

As shown in FIG. 29(b), the anode drive circuit having the first modified configuration of the second embodiment includes the PMOS transistor 303 and the NMOS depletion type transistor 302. The DRV ON-N signal of the negative logic for instructing on of the drive is connected to the PMOS transistor 303. Further, the NMOS depletion type transistor 302 is connected to the power source VDD.

Figure 29C:
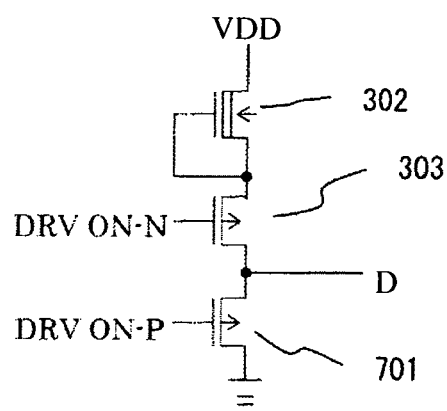

As shown in FIG. 29(c), the anode drive circuit having the second modified configuration of the second embodiment includes the NMOS depletion type transistor 302, the PMOS transistor 303, and the PMOS transistor 701. The DRV ON-N signal of the negative logic for instructing on of the drive is connected to the PMOS transistor 303. The DRV ON-P signal of the positive logic for instructing on of the drive is also connected to the PMOS transistor 701. Further, the NMOS depletion type transistor 302 is connected to the power source VDD.

Figure 29D:
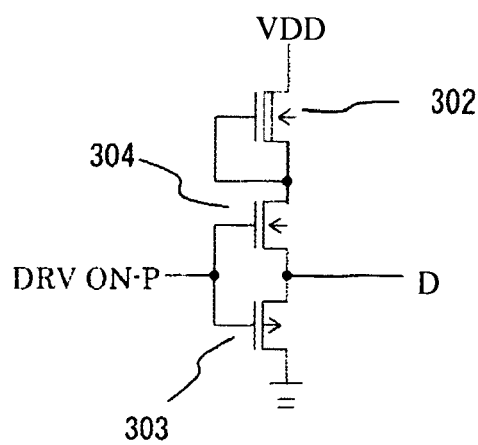

As shown in FIG. 29(d), the anode drive circuit having the second modified configuration of the second embodiment includes the NMOS depletion type transistor 302, the PMOS transistor 303, and the NMOS transistor 304. The gate terminals of the NMOS transistor 304 and the PMOS transistor 303 are connected to the DRV ON-P signal of the positive logic for instructing on of the drive. Further, the NMOS depletion type transistor 302 is connected to the power source VDD.

Modified Configurations of Third Embodiment

Figure 30A:
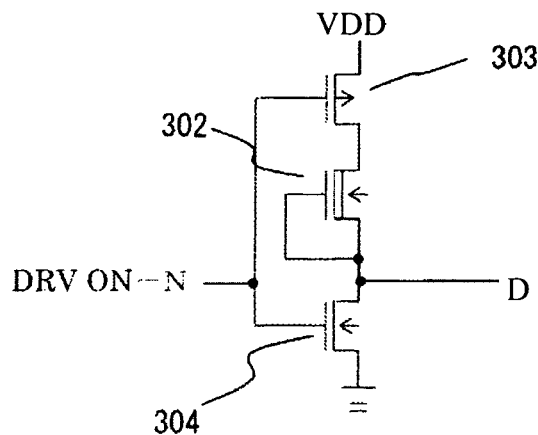
Figure 30B:
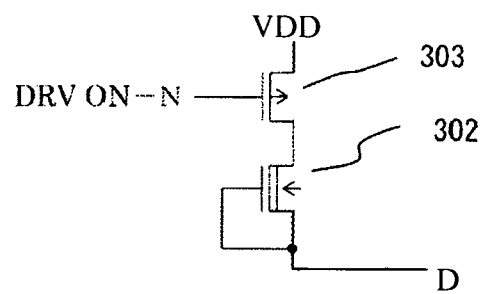
Figure 30C:
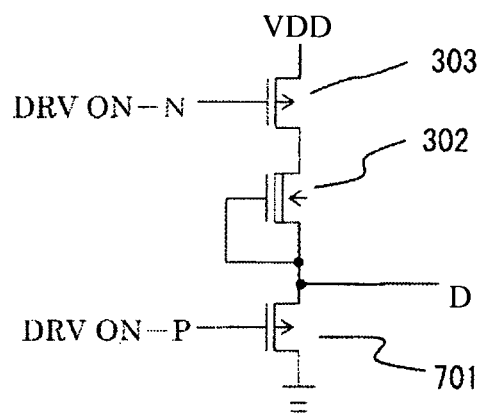
Figure 30D:
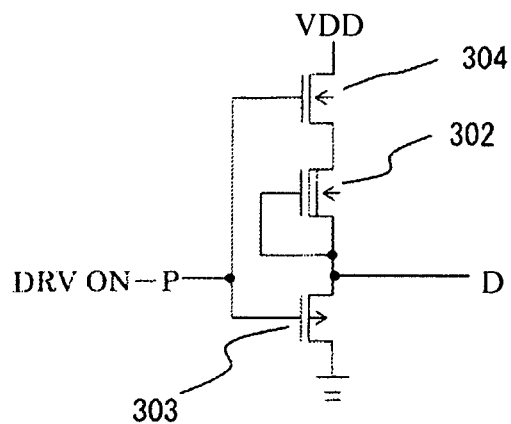

Modified configurations of the third embodiment will be explained next. FIGS. 30(a) to 30(d) are circuit diagrams showing the modified configurations of the anode drive circuit 401 according to the third embodiment of the present invention. More specifically, FIG. 30(a) is the circuit diagram of the configuration of the anode drive circuit 401 according to the third embodiment of the present invention, FIG. 30(b) is a circuit diagram of a first modified configuration of the anode drive circuit 401, FIG. 30(c) is a circuit diagram of a second modified configuration of the anode drive circuit 401, and FIG. 30(d) is a circuit diagram of a third modified configuration of the anode drive circuit 401.

As explained in the third embodiment, as shown in FIG. 30(a), the anode drive circuit 401 includes the PMOS transistor 303, the NMOS transistor 304, and the NMOS depletion type transistor 302. The gate terminals of the PMOS transistor 303 and the NMOS transistor 304 are connected to the DRV ON-N signal of the negative logic for instructing on of the drive.

As shown in FIG. 30(b), the anode drive circuit having the first modified configuration of the third embodiment includes the PMOS transistor 303 and the NMOS depletion type transistor 302. The DRV ON-N signal of the negative logic for instructing on of the drive is connected to the gate terminal of the PMOS transistor 303. The source terminal of the NMOS depletion type transistor 302 is connected to the gate terminal thereof, and further connected to the data terminal D.

As shown in FIG. 30(c), the anode drive circuit having the second modified configuration of the third embodiment includes the NMOS depletion type transistor 302, the PMOS transistor 303, and the PMOS transistor 701. The DRV ON-N signal of the negative logic for instructing on of the drive is connected to the gate terminal of the PMOS transistor 303. The DRV ON-P signal of the positive logic for instructing on of the drive is also connected to the gate terminal of the PMOS transistor 701. Further, the source terminal of the NMOS depletion type transistor 302 is connected to the gate terminal thereof, and further connected to the data terminal D.

As shown in FIG. 30(d), the anode drive circuit having the second modified configuration of the third embodiment includes the NMOS depletion type transistor 302, the PMOS transistor 303, and the NMOS transistor 304. The gate terminals of the NMOS transistor 304 and the PMOS transistor 303 are connected to the DRV ON-P signal of the positive logic for instructing on of the drive. The source terminal of the NMOS depletion type transistor 302 is connected to the gate terminal thereof, and further connected to the data terminal D.

Modified Configurations of Fourth Embodiment

Figure 31A:
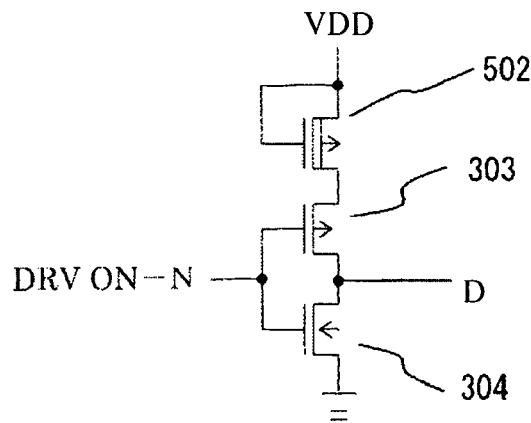
Figure 31B:
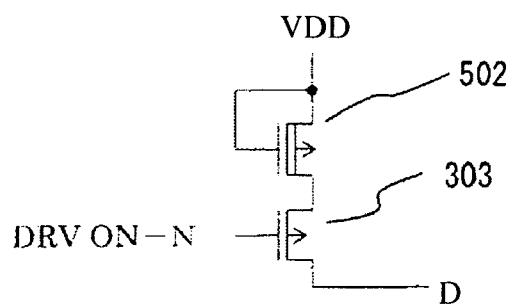
Figure 31C:
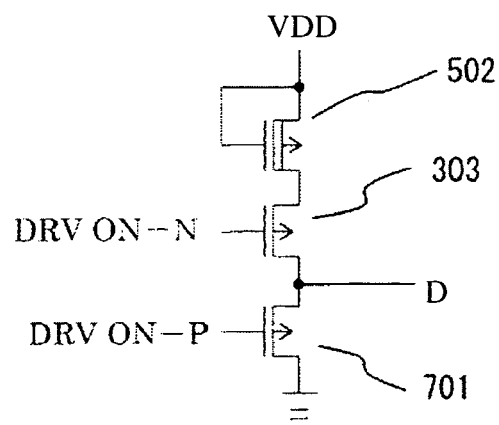
Figure 31D:
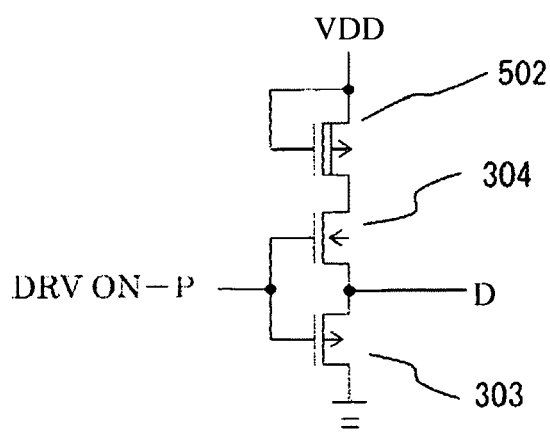

Modified configurations of the fourth embodiment will be explained next. FIGS. 31(a) to 31(d) are circuit diagrams showing the modified configurations of the anode drive circuit 501 according to the fourth embodiment of the present invention. More specifically, FIG. 31(a) is the circuit diagram of the configuration of the anode drive circuit 501 according to the fourth embodiment of the present invention, FIG. 31(b) is a circuit diagram of a first modified configuration of the anode drive circuit 501, FIG. 31(c) is a circuit diagram of a second modified configuration of the anode drive circuit 501, and FIG. 31(d) is a circuit diagram of a third modified configuration of the anode drive circuit 501.

As explained in the fourth embodiment, as shown in FIG. 31(a), the anode drive circuit 501 includes the PMOS depletion type transistor 502, the PMOS transistor 303, and the NMOS transistor 304. The source terminal and the gate terminal of the PMOS depletion type transistor 502 are connected to the power source VDD. The gate terminals of the PMOS transistor 303 and the NMOS transistor 304 are connected to the DRV ON-N signal of the negative logic for instructing on of the drive.

As shown in FIG. 31(b), the anode drive circuit having the first modified configuration of the fourth embodiment includes the PMOS depletion type transistor 502 and the PMOS transistor 303. The source terminal and the gate terminal of the PMOS depletion type transistor 502 are connected to the power source VDD. The DRV ON-N signal of the negative logic for instructing on of the drive is connected to the gate terminal of the PMOS transistor 303.

As shown in FIG. 31(c), the anode drive circuit having the second modified configuration of the fourth embodiment includes the PMOS depletion type transistor 502, the PMOS transistor 303, and the PMOS transistor 701. The source terminal and the gate terminal of the PMOS depletion type transistor 502 are connected to the power source VDD. The DRV ON-N signal of the negative logic for instructing on of the drive is connected to the gate terminal of the PMOS transistor 303. The DRV ON-P signal of the positive logic for instructing on of the drive is also connected to the gate terminal of the PMOS transistor 701.

As shown in FIG. 31(d), the anode drive circuit having the second modified configuration of the fourth embodiment includes the PMOS depletion type transistor 502, the PMOS transistor 303, and the NMOS transistor 304. The source terminal and the gate terminal of the PMOS depletion type transistor 502 are connected to the power source VDD. The gate terminals of the NMOS transistor 304 and the PMOS transistor 303 are connected to the DRV ON-P signal of the positive logic for instructing on of the drive.

Modified Configurations of Fifth Embodiment

Figure 32A:
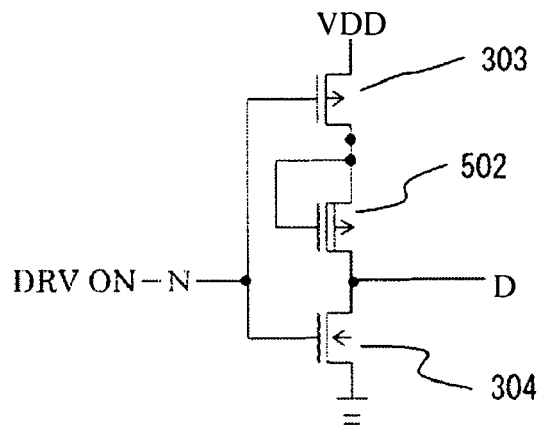
Figure 32B:
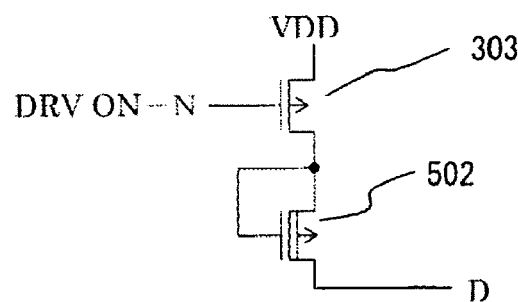
Figure 32C:
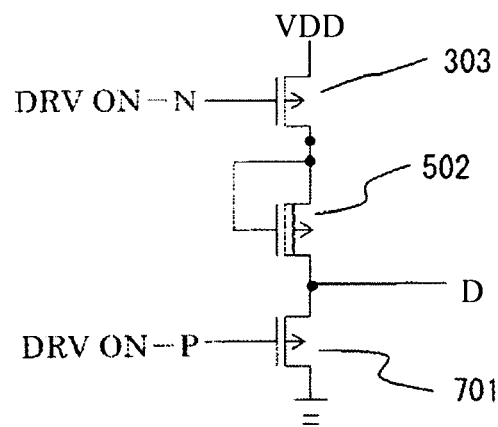
Figure 32D:
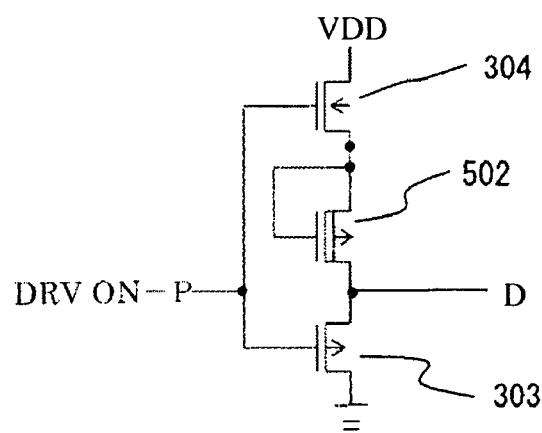

Modified configurations of the fifth embodiment will be explained next. FIGS. 32(a) to 32(d) are circuit diagrams showing the modified configurations of the anode drive circuit 601 according to the fifth embodiment of the present invention. More specifically, FIG. 32(a) is the circuit diagram of the configuration of the anode drive circuit 601 according to the fifth embodiment of the present invention, FIG. 32(b) is a circuit diagram of a first modified configuration of the anode drive circuit 601, FIG. 32(c) is a circuit diagram of a second modified configuration of the anode drive circuit 601, and FIG. 32(d) is a circuit diagram of a third modified configuration of the anode drive circuit 501.

As explained in the fifth embodiment, as shown in FIG. 32(a), the anode drive circuit 601 includes the PMOS depletion type transistor 502, the PMOS transistor 303, and the NMOS transistor 304. The source terminal of the PMOS transistor 303 is connected to the power source VDD, and the drain terminal thereof is connected to the source terminal and the gate terminal of the PMOS depletion type transistor 502. The drain terminal of the PMOS depletion type transistor 502 is connected to the drain terminal of the NMOS transistor 304. The gate terminals of the PMOS transistor 303 and the NMOS transistor 304 are connected to the DRV ON-N signal of the negative logic for instructing on of the drive.

As shown in FIG. 32(b), the anode drive circuit having the first modified configuration of the fifth embodiment includes the PMOS depletion type transistor 502 and the PMOS transistor 303. The source terminal of the PMOS transistor 303 is connected to the power source VDD, and the drain terminal thereof is connected to the source terminal and the gate terminal of the PMOS depletion type transistor 502. The drain terminal of the PMOS depletion type transistor 502 is connected to the data terminal D. The gate terminal of the NMOS transistor 304 is connected to the DRV ON-N signal of the negative logic for instructing on of the drive.

As shown in FIG. 32(c), the anode drive circuit having the second modified configuration of the fifth embodiment includes the PMOS depletion type transistor 502, the PMOS transistor 303, and the PMOS transistor 701. The source terminal and the gate terminal of the PMOS depletion type transistor 502 are connected to the power source VDD. The source terminal of the PMOS transistor 303 is connected to the power source VDD, and the drain terminal thereof is connected to the source terminal and the gate terminal of the PMOS depletion type transistor 502. The drain terminal of the PMOS depletion type transistor 502 is connected to the PMOS transistor 701. The DRV ON-N signal of the negative logic for instructing on of the drive is connected to the gate terminal of the PMOS transistor 303. The DRV ON-P signal of the positive logic for instructing on of the drive is also connected to the gate terminal of the PMOS transistor 701.

As shown in FIG. 32(d), the anode drive circuit having the second modified configuration of the fifth embodiment includes the PMOS depletion type transistor 502, the PMOS transistor 303, and the NMOS transistor 304. The NMOS transistor 304 is connected to the power source VDD, and further connected to the source terminal and the gate terminal of the PMOS depletion type transistor 502. The drain terminal of the PMOS depletion type transistor 502 are connected to the PMOS transistor 303. The gate terminals of the NMOS transistor 304 and the PMOS transistor 303 are connected to the DRV ON-P signal of the positive logic for instructing on of the drive.

The modified configurations described above provide effects similar to those in the first to fifth embodiments.

As described above, in the first to fifth embodiments, the drive circuit is applied to the light print head 19 of the electrophotography printer using the light emitting thyristors as the light source. Instead of the anode terminals of the light emitting thyristors, emitter terminals of PNP bipolar transistors may be connected. Instead of the gate terminals of the light emitting thyristors, base terminals of PNP bipolar transistors may be connected. In this case, the anode terminals of the light emitting thyristors may be connected to collector terminals of the bipolar transistors. Further, the cathode terminals of the light emitting thyristors may be replaced with cathode terminals of light emitting diodes.

Further, instead of the anode terminals of the light emitting thyristors, anode terminals of light emitting diodes may be connected. Cathode terminals of the light emitting diodes are connected to collector terminals of NPN bipolar transistors. Instead of the gate terminals of the light emitting thyristors, base terminals of NPN bipolar transistors may be connected. Instead of the cathode terminals of the light emitting thyristors, emitter terminals of NPN bipolar transistors may be connected. In this case, signal logic is inversed, and similar effects are obtained. PNP bipolar transistors and NPN bipolar transistor may be formed of a silicon material, a GaAs type semiconductor compound, or hetero connection bipolar transistor having the material.

The present invention may be applicable to a self-scanning type LED in which a shift register formed of a circuit including a thyristor drives light emitting thyristors. Further, the present invention is applicable to an organic EL head using an organic EL element as a light source. Further, the present invention is applicable to a configuration of a thermal head combined with a heating member, or a configuration of a display device for driving an array of display elements or surface light emitting elements.

The disclosure of Japanese Patent Application No. 2008-070473, filed on Mar. 18, 2008, is incorporated in the application by reference.

While the invention has been explained with reference to the specific embodiments of the invention, the explanation is illustrative and the invention is limited only by the appended claims.

What is claimed is:

1. A drive circuit for supplying a drive current to drive a plurality of driven elements each having two main electrodes, comprising:
    a switch circuit for receiving a drive signal; and
    a constant current circuit connected to the switch circuit for adjusting the drive current at a constant level, said constant current circuit including a constant current diode and a Schottky barrier diode connected to the constant current diode in parallel.

2. The drive circuit according to claim 1, wherein said constant current circuit is connected to an output terminal of the switch circuit.

3. The drive circuit according to claim 1, wherein said constant current circuit is configured to adjust the drive current for driving the driven elements formed of light emitting thyristors having three terminals.

4. A print head comprising,
    a drive circuit for supplying a drive current to drive a plurality of driven elements each, having two main electrodes, said drive circuit including a switch circuit for receiving a drive signal; and a constant current circuit connected to the switch circuit for adjusting the drive current at a constant level, said constant current circuit including a constant current diode and a Schottky barrier diode connected to the constant current diode in parallel.

5. The print head according to claim 4, wherein said constant current circuit is connected to an output terminal of the switch circuit.

6. An image forming apparatus comprising, a print head including a drive circuit for supplying a drive current to drive a plurality of driven elements each having two main electrodes, said drive circuit including a switch circuit for receiving a drive signal; and a constant current circuit connected to the switch circuit for adjusting the drive current at a constant level, said constant current circuit including a constant current diode and a Schottky barrier diode connected to the constant current diode in parallel.

7. The image forming apparatus according to claim 6, wherein said constant current circuit is connected to an output terminal of the switch circuit.

* * * * *